(12) United States Patent
You et al.

(10) Patent No.: US 11,004,922 B2
(45) Date of Patent: May 11, 2021

(54) ORGANIC LIGHT EMITTING DISPLAY DEVICE HAVING A SUB-PIXEL REGION AND A TRANSPARENT REGION

(71) Applicant: Samsung Display Co., Ltd., Yongin-si (KR)

(72) Inventors: Chun-Gi You, Asan-si (KR); Gwang-Geun Lee, Asan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/411,760

(22) Filed: Jan. 20, 2017

(65) Prior Publication Data

US 2017/0207285 A1    Jul. 20, 2017

(30) Foreign Application Priority Data

Jan. 20, 2016  (KR) ......................... 10-2016-0006970

(51) Int. Cl.
*H01L 27/32*  (2006.01)
*H01L 51/52*  (2006.01)
*H01L 27/12*  (2006.01)

(52) U.S. Cl.
CPC ........ *H01L 27/3262* (2013.01); *H01L 27/326* (2013.01); *H01L 27/3206* (2013.01); *H01L 27/3246* (2013.01); *H01L 27/3276* (2013.01); *H01L 51/5209* (2013.01); *H01L 51/5215* (2013.01); *H01L 51/5225* (2013.01); *H01L 27/124* (2013.01); *H01L 27/1248* (2013.01); *H01L 27/3213* (2013.01); *H01L 27/3248* (2013.01); *H01L 27/3258* (2013.01); *H01L 51/5218* (2013.01); *H01L 2251/5323* (2013.01); *H01L 2251/558* (2013.01)

(58) Field of Classification Search
CPC ............ H01L 27/3262; H01L 27/3206; H01L 27/326; H01L 51/5215
USPC ............................................ 257/40, E51.022
See application file for complete search history.

(56) References Cited

U.S. PATENT DOCUMENTS

| 2005/0264184 A1* | 12/2005 | Park .................... H01L 27/3267 313/504 |
| 2011/0148944 A1* | 6/2011 | Kobayashi ........... G09G 3/3225 345/690 |
| 2012/0049215 A1* | 3/2012 | Yoon ................... H01L 27/3246 257/91 |

(Continued)

FOREIGN PATENT DOCUMENTS

KR    10-2009-0047158 A    5/2009

*Primary Examiner* — Robert T Huber
(74) *Attorney, Agent, or Firm* — Innovation Counsel LLP

(57) ABSTRACT

An organic light emitting diode display device comprises a substrate which includes a plurality of pixel regions each having a sub-pixel region and a transparent region. In each pixel region, an active layer is disposed in the sub-pixel region. A gate electrode overlaps the active layer. A first electrode is disposed on the active layer, and contacts the active layer. A second electrode is spaced apart from the first electrode, and contacts the active layer. A first lower electrode having a first thickness is disposed in the sub-pixel region and connected to the second electrode. A second lower electrode is disposed in the transparent region on the substrate, located at a same level as the gate electrode. The second lower electrode has a second thickness that is less than the first thickness, and is transparent.

20 Claims, 14 Drawing Sheets

(56) References Cited

U.S. PATENT DOCUMENTS

| | | | | |
|---|---|---|---|---|
| 2012/0168755 A1* | 7/2012 | Choi | ..................... | H01L 27/124 |
| | | | | 257/59 |
| 2012/0267611 A1* | 10/2012 | Chung | ................ | H01L 27/3211 |
| | | | | 257/40 |
| 2013/0187131 A1* | 7/2013 | Chung | ................. | H01L 27/326 |
| | | | | 257/40 |
| 2013/0328022 A1* | 12/2013 | Choi | .................. | H01L 51/5008 |
| | | | | 257/40 |
| 2014/0158995 A1* | 6/2014 | Park | ................... | H01L 27/3262 |
| | | | | 257/40 |
| 2015/0048999 A1* | 2/2015 | Hsieh | .................. | G06F 3/1423 |
| | | | | 345/1.1 |
| 2016/0149155 A1* | 5/2016 | Kim | .................. | H01L 51/5228 |
| | | | | 257/40 |
| 2017/0200778 A1* | 7/2017 | Jeon | ................... | H01L 27/3213 |

* cited by examiner

FIG. 1
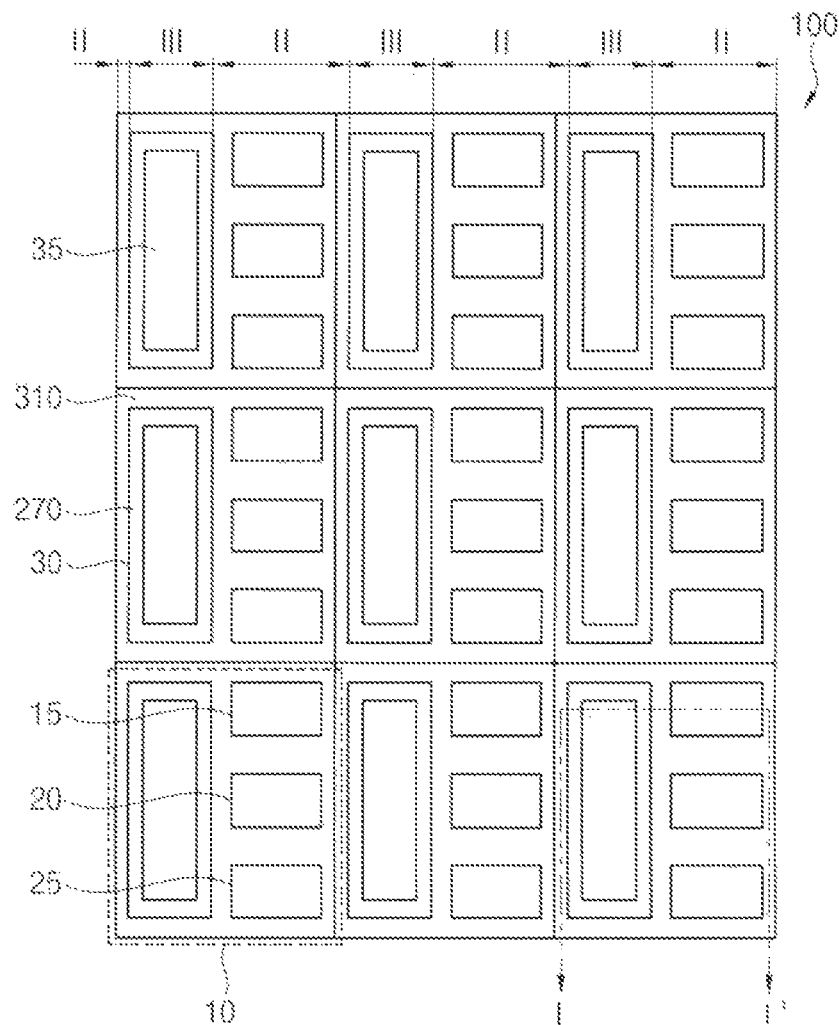
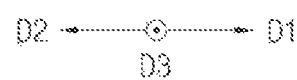

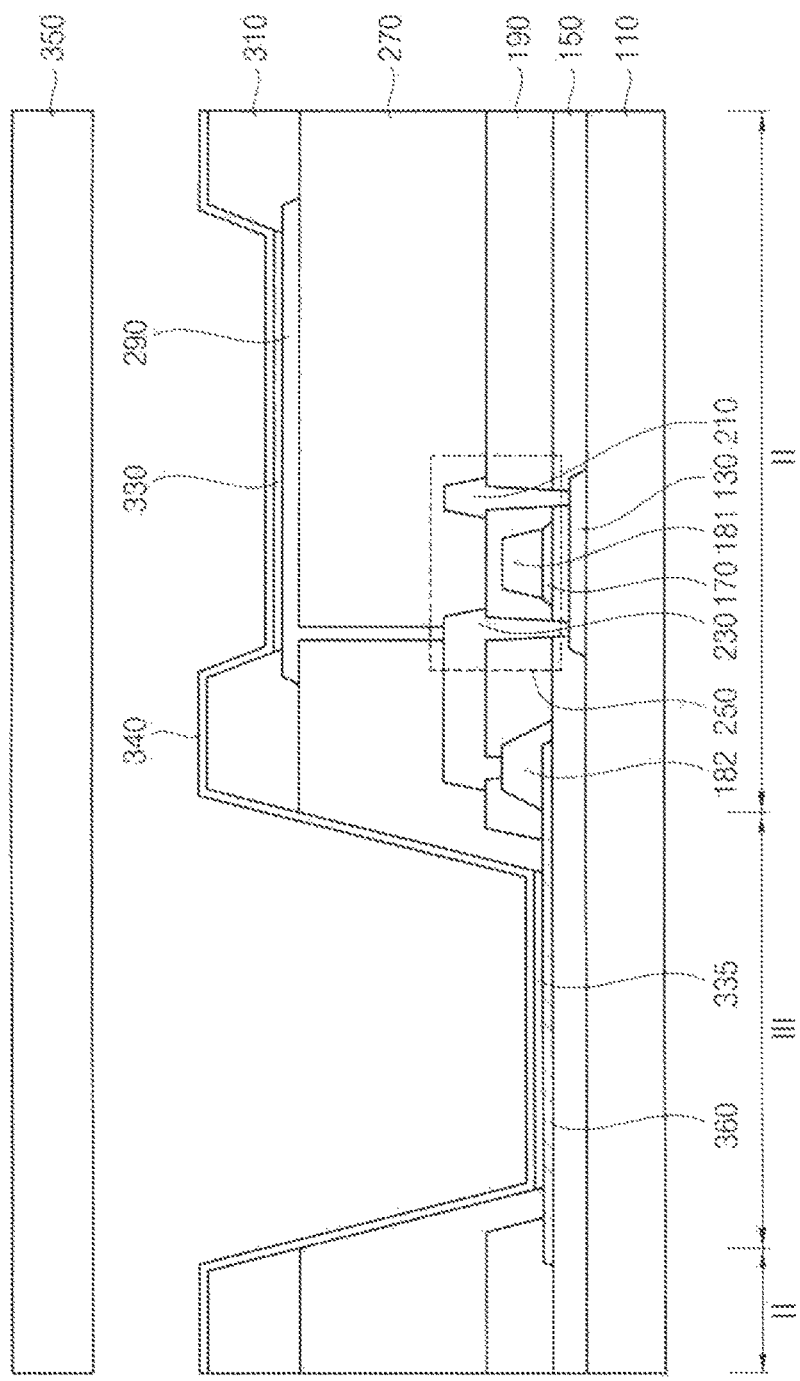

ORGANIC LIGHT EMITTING DISPLAY DEVICE HAVING A SUB-PIXEL REGION AND A TRANSPARENT REGION

CROSS-REFERENCE TO RELATED APPLICATION(S)

This application claims priority under 35 USC § 119 to Korean Patent Application No. 10-2016-0006970 filed on Jan. 20, 2016 in the Korean Intellectual Property Office (KIPO), the contents of which are incorporated herein by reference in their entirety.

BACKGROUND

1. Field

Example embodiments relate generally to organic light emitting display devices. More particularly, example embodiments relate to organic light emitting display devices including a transparent region.

2. Description of the Related Art

A flat panel display (FPD) device is widely used in many modern electronic devices because the FPD device is lightweight and thin as compared to a cathode-ray tube (CRT) display device. Typical examples of an FPD device are a liquid crystal display (LCD) device and an organic light emitting (OLED) display device. Compared to the LCD device, the OLED device has many advantages such as higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby emitting light of a certain wavelength.

Recently, a transparent OLED device has been developed, which is capable of transmitting an image of an object (or a target) that is located in the rear (e.g., the back) of the OLED device by including a transparent region. Here, since the OLED device includes a transparent region, an opening ratio of pixels may be relatively reduced. In addition, since the transparent region of the OLED device only performs a light transmission function, the OLED device may operate in a high luminance mode to compensate for any reduction in image quality due to the reduction in opening ratio. As a result, a life time of the pixels of the OLED device may be reduced, and the consumption of electrical power of the OLED device may be increased.

SUMMARY

Some example embodiments provide an organic light emitting display device including a light emitting layer in a transparent region.

According to some aspect of example embodiments, an organic light emitting display (OLED) device includes a substrate, an active layer, a gate electrode, a first electrode, a second electrode, a first electrode, a second electrode, a first lower electrode, a first light emitting layer, a second lower electrode, a second light emitting layer, and an upper electrode. The substrate includes a plurality of pixel regions each having a sub-pixel region and a transparent region. Each pixel comprises: an active layer disposed in the sub-pixel region on the substrate; a gate electrode overlapping the active layer; a first electrode disposed on the active layer, and in contact with a first portion of the active layer; a second electrode spaced apart from the first electrode on the active layer, and in contact with a second portion of the active layer; a first lower electrode disposed in the sub-pixel region and connected to the second electrode, and having a first thickness; a first light emitting layer disposed in the sub-pixel region and positioned on the first lower electrode; a second lower electrode disposed in the transparent region on the substrate, and located at a same level as the gate electrode. The second lower electrode has a second thickness that is less than the first thickness, and is transparent. Also included is a second light emitting layer disposed in the transparent region and positioned on the first lower electrode; and an upper electrode disposed on the first and second light emitting layers.

In example embodiments, a thickness of the second lower electrode may be substantially the same as a thickness of the gate electrode, and the second lower electrode and the gate electrode may comprise the same material.

In example embodiments, the gate electrode may be disposed on the active layer.

In example embodiments, each pixel region of the OLED device may further include a gate insulation layer, a first insulating interlayer, and a planarization layer. The gate insulation layer may cover the active layer. The first insulating interlayer may extend in a first direction on the gate insulation layer, and may have a first opening exposing a portion of the second lower electrode in the transparent. The first insulating interlayer may cover the gate electrode in the sub-pixel region. The planarization layer may be on the first insulating interlayer, and may have a first opening exposing a portion of the second lower electrode in the transparent region. The planarization layer may cover the first and second electrodes in the sub-pixel region.

In example embodiments, each pixel region of the OLED device may further include a gate wiring and a second insulating interlayer. The gate wiring may be disposed on the first insulating interlayer, and may be configured to transmit a gate signal to the gate electrode. The gate wiring may have a thickness that is greater than a thickness of the gate electrode. The second insulating interlayer may be disposed between the first insulating interlayer and the planarization layer. The second insulating interlayer may have a third opening exposing a portion of the second lower electrode in the transparent region, and may cover the gate wiring in the sub-pixel region.

In example embodiments, the planarization layer may cover a side wall of the first opening of the first insulating interlayer in the transparent region, and may be in contact with an upper surface of the gate insulation layer.

In example embodiments, a size of the second opening may be less than a size of the first opening.

In example embodiments, the gate insulation layer and the first insulating interlayer may include one or more inorganic materials, and the planarization layer may include one or more organic materials.

In example embodiments, the second electrode may overlap at least a portion of the second lower electrode.

In example embodiments, the first insulating interlayer may include a first contact hole exposing a portion of the second lower electrode, and the second insulating interlayer may include a second contact hole exposing the first contact hole. The second electrode may extend into the first and second contact holes, so as to contact the second lower electrode.

In example embodiments, the planarization layer may include a third contact hole over the second electrode and the first lower electrode. The first lower electrode may extend into the third contact hole, so as to contact the second electrode.

In example embodiments, the active layer may be disposed on the gate electrode.

In example embodiments, each pixel region of the OLED device may further include a gate insulation layer, an insulating interlayer, and planarization layer. The gate insulation layer may have a first opening exposing a portion of the second lower electrode in the transparent region. The gate insulation layer may cover the gate electrode in the sub-pixel region. The insulating interlayer may be on the gate insulation layer, and may have a second opening exposing a portion of the second lower electrode in the transparent region. The insulating interlayer may cover the gate electrode. The planarization layer may be on the insulating interlayer, and may have a third opening exposing a portion of the second lower electrode in the transparent region. The planarization layer may cover the first and second electrodes. The planarization layer may cover side walls of a first opening of the gate insulation layer and a second opening of the insulation interlayer in the transparent region, and may contact an upper surface of the gate insulation layer.

In example embodiments, a size of the third opening may be less than a size of the first opening and less than a size of the second opening.

In example embodiments, the gate insulation layer and the insulating interlayer may include one or more inorganic materials, and the planarization layer may include one or more organic materials.

In example embodiments, the second electrode may overlap at least a portion of the second lower electrode. The gate insulation layer may have a first contact hole exposing a portion of the second lower electrode, and the insulating interlayer may have a second contact hole exposing the first contact hole. The second electrode may extend into the first and second contact holes so as to contact the second lower electrode. The planarization layer may have a third contact hole positioned over the second electrode and the first lower electrode. The first lower electrode may extend into the third contact hole, so as to contact the second electrode.

In example embodiments, the first light emitting layer may be positioned so as to emit light in a direction that is perpendicular to an upper surface of the substrate, and the second light emitting layer may be positioned so as to emit light in two directions that are both perpendicular to the upper surface of the substrate.

In example embodiments, the first lower electrode may be configured to reflect light emitted from the first light emitting layer, and the second lower electrode may be configured to transmit light emitted from the second light emitting layer.

In example embodiments, the second light emitting layer may be configured to emit a white colored light.

In example embodiments, when the second light emitting layer does not emit light, the transparent region may be configured to pass light therethrough.

As an OLED device according to example embodiments includes a second lower electrode that is disposed at the same level as the gate electrode, the number of a manufacturing processes of the OLED device may be decreased. Accordingly, a manufacturing cost of the OLED device may be reduced. In addition, as the first insulating interlayer is disposed at a thin thickness, a capacitance of a storage capacitor including the gate electrode and the gate wiring may be increased. Further, as the gate electrode has a thin thickness, a cut phenomenon of the first insulating interlayer covering the gate electrode may be decreased. Meanwhile, the OLED device may include a second light emitting layer. Accordingly, deterioration of a pixel included in the OLED device may be reduced or prevented. In addition, as the second light emitting layer emits a white colored light, the OLED device may consume less electrical power.

BRIEF DESCRIPTION OF THE DRAWINGS

Example embodiments can be understood in more detail from the following description taken in conjunction with the accompanying drawings, in which:

FIG. 1 is a plan view illustrating an organic light emitting display (OLED) device in accordance with example embodiments;

FIG. 10 is a cross-sectional view illustrating an OLED device in accordance with example embodiments;

FIG. 14 is a cross-sectional view illustrating an OLED device in accordance with example embodiments.

DETAILED DESCRIPTION OF EMBODIMENTS

Figure 2:
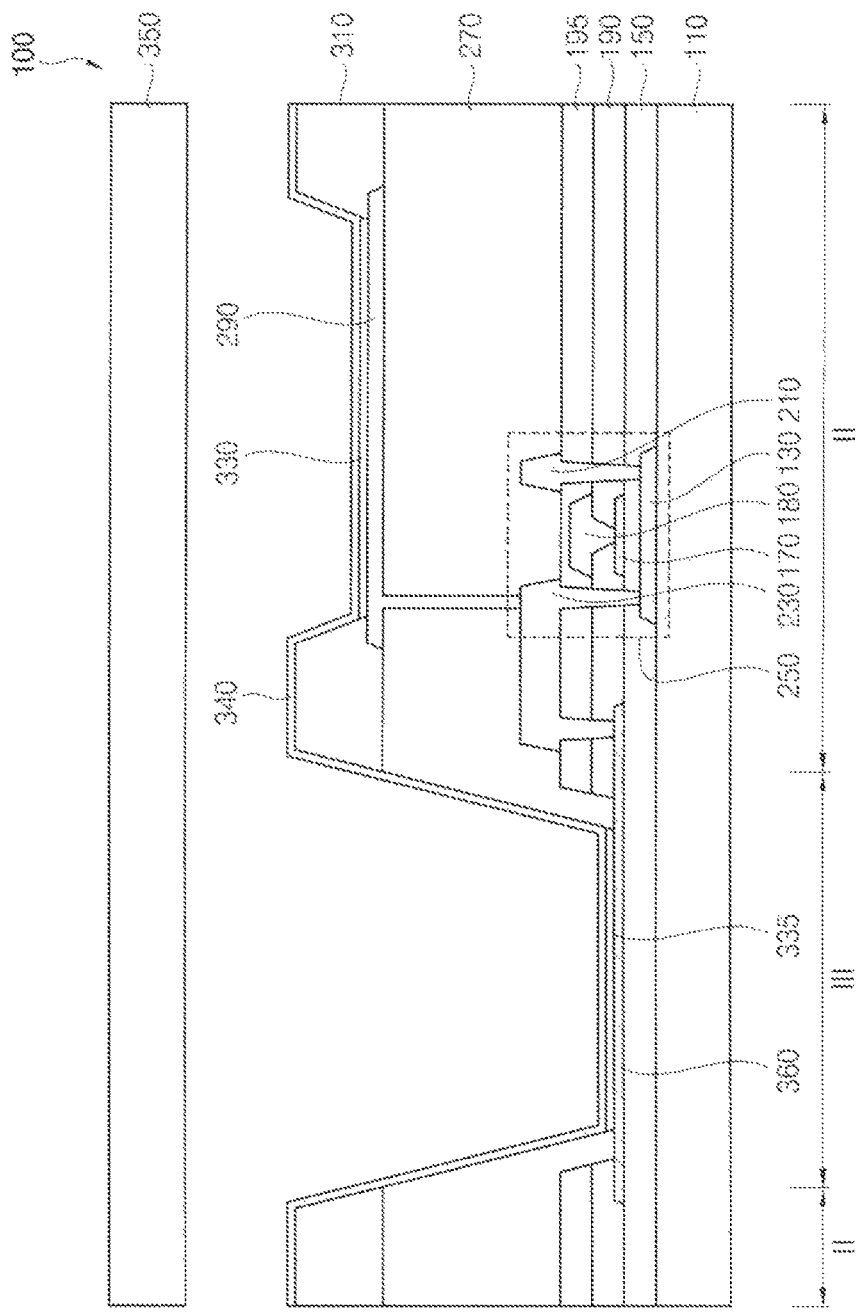
FIG. 2 is a cross-sectional view taken along a line I-I' of FIG. 1.

Hereinafter, embodiments of the present inventive concept will be explained in detail with reference to the accompanying drawings. The various Figures are not necessarily to scale. All numerical values are approximate, and may vary. All examples of specific materials and compositions are to be taken as nonlimiting and exemplary only. Other suitable materials and compositions may be used instead.

FIG. 1 is a plan view illustrating an organic light emitting display (OLED) device in accordance with example embodiments.

Referring to FIG. 1, an organic light emitting display (OLED) device 100 may include a plurality of pixel regions. One such pixel region 10 may include a sub-pixel region II and a transparent region III. For example, the pixel regions 10 may be arranged sequentially along first and second directions D1 and D2 over the entire substrate, which will be described below, included in the OLED device 100. Here, the first direction D1 may be parallel to an upper surface of the substrate, and the second direction D2 may be perpendicular to the first direction D1.

In the sub-pixel region II, first, second, and third sub-pixels 15, 20, and 25 may be disposed. As one example, the first sub-pixel 15 may emit a red color of light, and the second sub-pixel 20 may emit a green color of light. In addition, the third sub-pixel 25 may emit a blue color of light. The first through third sub-pixels 15, 20, and 25 may be substantially surrounded by a pixel defining layer 310.

In the transparent region III a transparent window may be located. The transparent window may be substantially surrounded by the pixel defining layer 310. Light incident from the outside may be transmitted via the transparent window. In example embodiments, a fourth sub-pixel 35 may be disposed in the transparent region III. The fourth sub-pixel 35 may be surrounded by a planarization layer 270. To transmit light in the transparent region III, a thickness of a second lower electrode included in the fourth sub-pixel 35 may be less than that of a first lower electrode included in the first through third sub-pixels 15, 20, and 25. In addition, the fourth sub-pixel 35 may emit a white color of light. Alternatively, the fourth sub-pixel 35 may emit a red color of a light, a green color of a light, a blue color of a light, etc. Accordingly, a light may be emitted by the fourth sub-pixel 35 in the transparent region III of the OLED device 100.

In example embodiments, one pixel region 10 of the OLED device 100 includes the first through third sub-pixels 15, 20, and 25 and one transparent window 30, but embodiments are not limited thereto. In other example embodiments, for instance, a plurality of pixel regions 10 may correspond to one transparent window 30. In addition, the first through third sub-pixels 15, 20, and 15 are regularly arranged, but are not limited thereto. For example, the first through third sub-pixels 15, 20, and 15 may be irregularly arranged.

Figure 3:
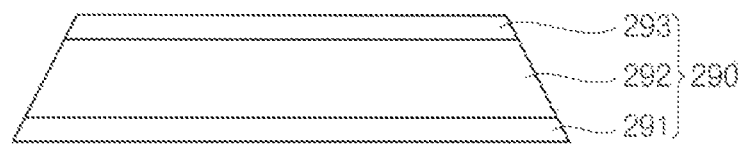
FIG. 3 is a cross-sectional view describing a first lower electrode included in the OLED device of FIG. 2.

FIG. 2 is a cross-sectional view taken along a line I-I' of FIG. 1, and FIG. 3 is a cross-sectional view describing a first lower electrode included in the OLED device of FIG. 2.

Referring to FIGS. 2 and 3, an OLED device 100 may include a substrate 110, a semiconductor element 250, a gate wiring 180, a planarization layer 270, a first lower electrode 290, a pixel defining layer 310, a second lower electrode 360, a first light emitting layer 330, a second light emitting layer 335, an upper electrode 340, an encapsulation substrate 350, etc. Here, the semiconductor element 250 may include an active layer 130, a gate electrode 170, a first electrode 210, a second electrode 230, a gate insulation layer 150, a first insulating interlayer 190, and second insulating interlayer 195. In addition, a first lower electrode 290 may have a first thickness, and the second lower electrode 360 may have a second thickness that is less than the first thickness.

As described above, the OLED device 100 may include a plurality of pixel regions. One pixel region may have a sub-pixel region II and a transparent region III.

The semiconductor element 250, the first lower electrode 290, the first light emitting layer 330, etc may be disposed in the sub-pixel region II. The second lower electrode 360, the second light emitting layer 335, etc. may be disposed in the transparent region III. Meanwhile, the upper electrode 340 may be entirely disposed in the sub-pixel region II and the transparent region III.

A display image may be displayed in the sub-pixel region II, and light may be emitted by the second light emitting layer 335 in the transparent region III. However, the second light emitting layer 335 and the second lower electrode 360 may be substantially transparent. Accordingly, when the semiconductor element 250 is not activated (e.g., the first light emitting layer 330 and the second light emitting layer 335 are in their off or non-emissive state), an image of an object that is located at the back (e.g., in the rear) of the OLED device 100 may be transmitted through the transparent region III. As the OLED device 100 includes the transparent region III, the OLED device 100 may serve as a transparent display device.

The semiconductor element 250 may be disposed on the substrate 110. The substrate 110 may be formed of transparent materials or opaque materials. For example, the substrate 110 may include a quartz substrate, a synthetic quartz substrate, a calcium fluoride substrate, a fluoride-doping quartz substrate, a sodalime substrate, a non-alkali substrate, etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the pixel structure (e.g., the semiconductor element 250, the second lower electrode 360, the second light emitting layer 335, the first lower electrode 290, the first light emitting layer 330, the upper electrode 340, etc.). That is, the substrate 110 may have a structure in which the first polyimide layer, the barrier film layer and the second polyimide layer are stacked on a rigid glass substrate. In manufacturing the OLED device 100, after an insulating layer (e.g., a buffer layer) is provided on the second polyimide layer of the polyimide substrate, the pixel structure may be disposed on the insulating layer. After the pixel structure is formed on the insulating layer, the rigid glass substrate under which the polyimide substrate is disposed may be removed. It may be difficult to directly form the pixel structure on an isolated polyimide substrate because the polyimide substrate is relatively thin and flexible. Accordingly, the pixel structure is formed on a polyimide substrate that is coupled to a rigid glass substrate, and then the polyimide substrate may serve as the substrate 110 of the OLED device 100 after removal of the rigid glass substrate. As the OLED device 100 includes the sub-pixel region II and the transparent region III, the substrate 110 may also include the sub-pixel region II and the transparent region III.

A buffer layer (not shown) may be disposed on the substrate 110. The buffer layer may be disposed over the entire substrate 110. The buffer layer may prevent the diffusion of metal atoms and/or impurities from the substrate 110 into the semiconductor element 250. Additionally, the buffer layer may control a rate of heat transfer in a crystallization process for forming the active layer 130, thereby obtaining a substantially uniform active layer. Furthermore, the buffer layer may improve a surface flatness of the substrate 110 when a surface of the substrate 110 is relatively uneven. According to the type of substrate 110, at least two buffer layers may be provided on the substrate 110, or the buffer layer may not be present. The buffer layer may include organic materials or inorganic materials.

The semiconductor element 250 may be formed of the active layer 130, the gate electrode 170, the first electrode 210, the second electrode 230, the gate insulation layer 150, the first insulating interlayer 190, and the second insulating interlayer 195. The semiconductor element 250 may be disposed in the sub-pixel region II on the substrate 110.

The active layer 130 may be disposed in the sub-pixel region II on the substrate 110. As an example, the active layer 130 may be formed of an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may extend in a first direction D1 on the substrate 110. Here, the first direction D1 may be parallel to an upper surface of the substrate 110, or may extend from the transparent region III into the sub-pixel region II. The gate insulation layer 150 may cover the active layer 130 in the sub-pixel region II, and may be disposed over the entire substrate 110. For example, the gate insulation layer 150 may sufficiently cover the active layer 130, and may have a substantially even surface without a step around the active layer 130. Alternatively, the gate insulation layer 150 may cover the active layer 130, and may be disposed with a substantially uniform thickness along a profile of the active layer 130. The gate insulation layer 150 may be formed of a silicon compound, a metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In example embodiments, the gate insulation layer 150 may include inorganic materials.

The gate electrode 170 may be disposed in the sub-pixel region II on the gate insulation layer 150. The gate electrode 170 may be disposed to overlap the active layer 130 in plan view. In example embodiments, the gate electrode 170 may have a relatively thin thickness (e.g., a second thickness), and may be substantially transparent. Since a thickness of the gate electrode 170 is thin, a wiring resistance of the gate electrode 170 may be high. Thus, the gate electrode 170 may not perform a wiring function providing a gate signal of the OLED device 100, and may instead serve as a gate electrode switching the active layer 130. For example, a gate signal of the OLED device 100 may be provided by the gate wiring 180, and the gate wiring 180 may be electrically connected to the gate electrode 170. In addition, the gate wiring 180 may provide the gate signal to the gate electrode 170.

The second lower electrode 360 may be spaced apart from the gate electrode 170 in the transparent region III and a portion of the sub-pixel region II on the gate insulation layer 150. In example embodiments, the second lower electrode 360 and the gate electrode 170 may be disposed at the same level or layer, may be simultaneously formed using the same materials (e.g. formed from the same material layer). The second lower electrode 360 and the gate electrode 170 may have the same thickness, and the second lower electrode 360 may transmit light. For example, light incident from an external source may be transmitted via the transparent region III. When a transmissivity of the OLED device 100 is high in the transparent region III, an image of an object behind the OLED device 100 may be clearly visually recognized. Thus, an electrode, a wiring, a semiconductor element, etc. capable of reducing the transmissivity may not be disposed in the transparent region III. Although the second lower electrode 360 is disposed in the transparent region III, a transmissivity of the OLED device 100 may not be significantly reduced because a thickness of the second lower electrode 360 is thin and substantially transparent.

As described above, to transmit light through the transparent region III, the OLED device 100 may be manufactured as a dual emission structure in the transparent region III. That is, the second lower electrode 360 is transparent. For example, the OLED device 100 may transmit light emitted from the second light emitting layer 335 through the back of (e.g., a fourth direction D4 that is orthogonal to the first direction D1 and a second direction D2, and opposite to the third direction D3) of the OLED device 100. Each of the gate electrode 170 and the second lower electrode 360 may include a metal, a metal alloy, metal nitride, conductive metal oxide, transparent conductive materials, etc. For example, each of the gate electrode 170 and the second lower electrode 360 may be formed of gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof.

In example embodiments, the second lower electrode 360 of the OLED device 100 includes a single layer, but is not limited thereto. In some example embodiments, the second lower electrode 360 may have a multi-layered structure.

In addition, the second lower electrode 360 and the gate electrode 170 are simultaneously formed at the same level, but embodiments are not limited thereto. For example, the second lower electrode 360 and the active layer 130 may be formed at different levels and/or at different times.

The first insulating interlayer 190 may be disposed on the gate electrode 170 and the second lower electrode 360. The first insulating interlayer 190 may extend in the first direction D1 on the gate insulation layer 150, and may have a first opening exposing a portion of the second lower electrode 360 in the transparent region III. In addition, the first insulating interlayer 190 may cover the gate electrode 170 in the sub-pixel region II. For example, the first insulating interlayer 190 may sufficiently cover the gate electrode 170, and may have a substantially even surface without a step around the gate electrode 170. Alternatively, the first insulating interlayer 190 may cover the gate electrode 170, and may be disposed with a substantially uniform thickness along a profile of the gate electrode 170. In example embodiments, a cut phenomenon of the first insulating interlayer 190 may be significantly decreased when the gate electrode 170 is relatively thin. For example, a thickness of a conventional gate electrode may be significantly greater. In this case, when the first insulating interlayer is disposed as a substantially uniform thickness along a profile of a conventional thick gate electrode, a cut phenomenon of the first insulating interlayer may frequently occur in a portion covering the gate electrode, leading to defects in OLED device.

As the gate electrode 170 included in the OLED device 100 according to example embodiments has a relatively thin thickness, a cut phenomenon of the first insulating interlayer 190 may be significantly decreased. In addition, the gate electrode and the gate wiring may serve as a storage capacitor in another cross-sectional view of the OLED device 100. In this case, a distance between the gate electrode corresponding to a lower electrode of the storage capacitor and gate wiring corresponding to an upper electrode of the storage capacitor may be decreased due to the first insulating interlayer 190 having a relatively thin thickness. Accordingly, a capacitance of the storage capacitor may be increased. The first insulating interlayer 190 may include a silicon compound, a metal oxide, etc. In example embodiments, the first insulating interlayer 190 may be formed of one or more inorganic materials.

The gate wiring 180 may be disposed on the first insulating interlayer 190. A thickness of the gate wiring 180 may be greater than that of the gate electrode 170. As described above, the gate wiring 180 may provide a gate signal of the OLED device 100 to the gate electrode 170. In addition, the gate wiring 180 may be in contact with the gate electrode 170 via a contact hole located in the first insulating interlayer 190, and may thereby be electrically connected to the gate electrode 170. Since a thickness of the gate wiring 180 is relatively greater than that of the gate electrode 170, the gate wiring 180 may have a relatively low wiring resistance.

The second insulating interlayer 195 may be disposed on the gate wiring 180. The second insulating interlayer 195 may be interposed between the first insulating interlayer 190 and the planarization layer 270. The second insulating interlayer 195 may extend in the first direction D1 on the first insulating interlayer 190, and may have an opening (e.g., a third opening) exposing a portion of the second lower electrode 360 in the transparent region III. In addition, the second insulating interlayer 195 may cover the gate wiring 180 in the sub-pixel region II. For example, the second insulating interlayer 195 may sufficiently cover the gate wiring 180, and may have a substantially even surface without a step around the gate wiring 180. Alternatively, the second insulating interlayer 195 may cover the gate wiring 180, and may be disposed at a substantially uniform thickness along a profile of the gate wiring 180. The second insulating interlayer 195 may be formed of a silicon compound, a metal oxide, etc. In example embodiments, the second insulating interlayer 195 may include inorganic materials.

The first electrode 210 and the second electrode 230 may be disposed on the second insulating interlayer 195. The first electrode 210 may be in contact with a first side of the active layer 130 via a contact hole formed in the gate insulation layer 150, the first insulating interlayer 190, and the second insulating interlayer 195. The second electrode 230 may be in contact with a second side of the active layer 130 via a contact hole formed in the gate insulation layer 150, the first insulating interlayer 190, and the second insulating interlayer 195. Accordingly, the semiconductor element 250 includes the active layer 130, the gate electrode 170, the first electrode 210, and the second electrode 230.

In example embodiments, the second electrode 230 may extend from the sub-pixel region II into the transparent region III, to overlap at least a portion of the second lower electrode 360. The first insulating interlayer 190 may have a first contact hole exposing a portion of the second lower electrode 360 in the area of overlap. In addition, the second insulating interlayer 195 may have a second contact hole exposing the first contact hole in the area of overlap. The second electrode 230 may be in contact with the second lower electrode 360 via the first and second contact holes. Thus, the semiconductor element 250 may be electrically connected to the second lower electrode 360. In this manner, the first electrode 210 may be a source electrode, and the second electrode 230 may be a drain electrode. Alternatively, the first electrode 210 may be a drain electrode, and the second electrode 230 may be a source electrode. Each of the first electrode 210 and the second electrode 230 may be formed of a metal, an alloy, metal nitride, conductive metal oxide, transparent conductive materials, etc.

The planarization layer 270 may be disposed on the first and second electrodes 210 and 230. The planarization layer 270 may extend in the first direction D1 on the second insulating interlayer 195. The planarization layer 270 may have an opening (e.g., a second opening) exposing a portion of the second lower electrode 360 in the transparent region III, and may cover the first electrode 210 and the second electrode 230 in the sub-pixel region II. For example, the planarization layer 270 may be disposed with a relatively high thickness to sufficiently cover the first and second electrodes 210 and 230. In this case, the planarization layer 270 may have a substantially even upper surface, and a planarization process may be further performed on the planarization layer 270 to implement the even upper surface of the planarization layer 270. Alternatively, the planarization layer 270 may cover the first and second electrodes 210 and 230, and may be disposed at a substantially uniform thickness along a profile of the first and second electrodes 210 and 230.

The planarization layer 270 may cover a side wall of a first opening in the first insulating interlayer 190 and a side wall of a third opening in the second insulating interlayer 195 in the transparent region III, and may be in contact with an upper surface of the second lower electrode 360. For example, the planarization layer 270 may not expose a side wall of the first and third openings. That is, a size (e.g., an area or a dimension) of the second opening of the planarization layer 270 may be less than a size of each of the first and third openings. As at least a portion of the planarization layer 270 is disposed on the second lower electrode 360, the planarization layer 270 may serve as a pixel defining layer in the transparent region III. For example, the planarization layer 270 may define an outer boundary of the second light emitting layer 335 in the transparent region III, i.e. the second light emitting layer 335 may be located in the second opening. The planarization layer 270 may include organic materials or inorganic materials. In example embodiments, the planarization layer 270 may include organic materials. For example, the planarization layer 270 may be formed of a photoresist, a polyacryl-based resin, a polyimide-based resin, a polyamide-based resin, a siloxane-based resin, an acryl-based resin, an epoxy-based resin, etc.

The first lower electrode 290 may be disposed in the sub-pixel region II on the planarization layer 270, and may have the first thickness that is greater than the second thickness of the second lower electrode 360. The first lower electrode 290 may be in contact with the second electrode 230 via a contact hole formed in the planarization layer 270. In addition, the first lower electrode 290 may be electrically connected to the semiconductor element 250. The OLED device 100 may be manufactured as a top emission structure in the sub-pixel region II. Thus, the first lower electrode 290 may include a light reflection layer. For example, as illustrated in FIG. 3, the first lower electrode 290 may have a multilayer structure. The multilayer structure may include the first, second, and third electrode layers 291, 292, and 293. The first electrode layer 291 may be disposed in the sub-pixel region II on the planarization layer 270, and the second electrode layer 292 and the third electrode layer 293 may be sequentially disposed on the first electrode layer 291. Here, the first electrode layer 291 and the third electrode layer 293 may include substantially the same materials, and the second electrode layer 292 may be interposed between the first electrode layer 291 and the third electrode layer 293. A thickness of the first and third electrode layers 291 and 293 each may be substantially less than that of the second electrode layer 292, and a thickness of the first electrode layer 291 may be substantially the same as that of the third electrode layer 293.

The first electrode layer 291 may cover an uneven upper surface of the planarization layer 270. As the first electrode layer 291 is disposed on the planarization layer 270, the first electrode layer 291 may aid in the formation of the second electrode layer 292. As the third electrode layer 293 is disposed on the second electrode layer 292, a color coordinate of the OLED device 100 may be readily controlled. The second electrode layer 292 may serve as the light reflection layer. The second electrode layer 292 may reflect light emitted from the first light emitting layer 330 toward the front (e.g., a third direction D3 that is opposite to the fourth direction D4) of the OLED device 100. Thus, the first lower electrode 290 may be substantially opaque, as it includes the opaque and reflective second electrode layer 292. In alternate embodiments, the first lower electrode 290 may have a multilayer structure including only the first electrode layer 291 and the second electrode layer 292, or may have a single layer structure including only the second electrode layer 292. As an example, the second electrode layer 292 may be formed of a metal, a metal alloy, metal nitride, conductive metal oxide, transparent conductive materials, etc. Each of the first electrode layer 291 and the third electrode layer 293 may be substantially transparent. Each of the first electrode layer 291 and the third electrode layer 293 may include transparent conductive materials, etc.

Referring to FIG. 2, the pixel defining layer 310 may be disposed on the planarization layer 270 to expose a portion of the first lower electrode 290 and at least a portion of the second lower electrode 360. For example, the pixel defining layer 310 may cover outer edges of the first lower electrode 290, and may expose the second opening of the planarization layer 270. In this case, each of the first and second light emitting layers 330 and 335 may be located on portions of the first and second lower electrodes 290 and 360 that are exposed by the pixel defining layer 310. Here, an opening exposing the second lower electrode 360 formed in the transparent region III may be a transparent window of FIG. 1. The pixel defining layer 310 may be formed of organic materials or inorganic materials. In example embodiments, the pixel defining layer 310 may include organic materials.

The first light emitting layer 330 (e.g., a light emitting layer included in a first sub-pixel 15 of FIG. 1) may be disposed on an exposed portion of the first lower electrode 290. The first light emitting layer 330 may be formed using at least one of light emitting materials capable of generating different colors of light (e.g., a red colored light, a blue colored light, and a green colored light, etc.) according to the colors desired for, e.g., first, second, and third sub-pixels of FIG. 1, and may emit their light in the third direction D3. Alternatively, the first light emitting layer 330 may generally generate a white color of light by stacking a plurality of light emitting materials capable of generating different colors of light such as red, green and blue, etc. In this case, a color filter may be disposed on the first light emitting layer 330, and may not be disposed in the transparent region III. The color filter may include at least one selected from a red color filter, a green color filter, and a blue color filter. Alternatively, the color filter may include a yellow color filter, cyan color filter, and magenta color filter, or any other desired color(s). The color filter may be formed of a photosensitive resin (or color photoresist), etc.

The second light emitting layer 335 (e.g., a light emitting layer included in a fourth sub-pixel 35 of FIG. 1) may be disposed on an exposed portion of the second lower electrode 360. The second light emitting layer 335 may emit a white colored light according to the fourth sub-pixel of FIG. 1. The second light emitting layer 335 may be controlled by the semiconductor element 250. For example, when the semiconductor element 250 is activated (e.g., turned-on), the second light emitting layer 335 may emit a white color of light in both the third direction D3 and the fourth direction D4. When the semiconductor element 250 is not activated (e.g., turned-off), an image of an object that is located behind the OLED device 100 may be transmitted via the transparent region III. Accordingly, a light may be emitted by the second light emitting layer 335 in the transparent region III of the OLED device 100. The second light emitting layer 335 may have a tandem structure to emit a white colored light. For example, the second light emitting layer 335 may include a red light emitting layer, a green light emitting layer, and a blue light emitting layer, and charge generation layers (CGLs) may be interposed between the red light emitting layer and the green light emitting layer as well as between the green light emitting layer and the blue light emitting layer. For example, the red light emitting layer, a first CGL, the green light emitting layer, a second CGL, and the blue light emitting layer may be sequentially disposed on the second lower electrode 360. Alternatively, the CGLs may be disposed between the red light emitting layer and the green light emitting layer or between the green light emitting layer and the blue light emitting layer. In some example embodiments, the second light emitting layer 335 may generally generate white light by mixing a plurality of light emitting materials capable of generating different colors of light such as red, green, blue, etc. For example, the second light emitting layer 335 may generate blue light and yellow-green light by using a blue fluorescent material and a yellow-green phosphor material, and white light may be generated in a suitable mix thereof. In addition, various colors of light may be generated by controlling a mixing ratio of the light emitting materials. In this manner, for example, the light emitting materials may emit yellow light, violet light, sky-blue light, etc. Alternatively, the second light emitting layer 335 may emit red light, green light, or blue light similar to the first light emitting layer 330.

The upper electrode 340 may be disposed on the pixel defining layer 310 and the first and second light emitting layers 330 and 335. The upper electrode 340 may cover the pixel defining layer 310 and the first and second light emitting layers 330 and 335 in both the sub-pixel region II and the transparent region III. That is, the upper electrode 340 may overlap the first and second light emitting layers 330 and 335. The upper electrode 340 may be formed of a metal, a metal alloy, metal nitride, conductive metal oxide, transparent conductive materials, etc. These may be used alone or in any suitable combination thereof.

The encapsulation substrate 350 may be disposed on or over the upper electrode 340. The encapsulation substrate 350 and the substrate 110 may include substantially the same materials. For example, the encapsulation substrate 350 may include quartz, synthetic quartz, calcium fluoride, fluoride-doping quartz, sodalime glass, non-alkali glass etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

As the OLED device 100 in accordance with example embodiments includes the second lower electrode 360 that is disposed at the same level and at the same time as the gate electrode 170, the number of a manufacturing processes of the OLED device 100 (e.g., the number of a mask processes) may be decreased. Accordingly, a manufacturing cost of the OLED device 100 may be reduced. In addition, as the first insulating interlayer 190 is relatively thin, a capacitance of a storage capacitor including the gate electrode 170 and the gate wiring 180 may be increased. Further, as the gate electrode 170 is relatively thin, a cut phenomenon of the first insulating interlayer 190 covering the gate electrode 170 may be decreased. Meanwhile, the OLED device 100 may include the second light emitting layer 335. Accordingly, undesirably rapid deterioration of a pixel included in the OLED device 100 may be prevented. In addition, as the second light emitting layer 335 emits a white color of light, the OLED device 100 may have reduced power consumption.

FIGS. 4, 5, 6, 7, 8, 9, and 10 are cross-sectional views illustrating a method of manufacturing an OLED device in accordance with example embodiments.

Figure 4:
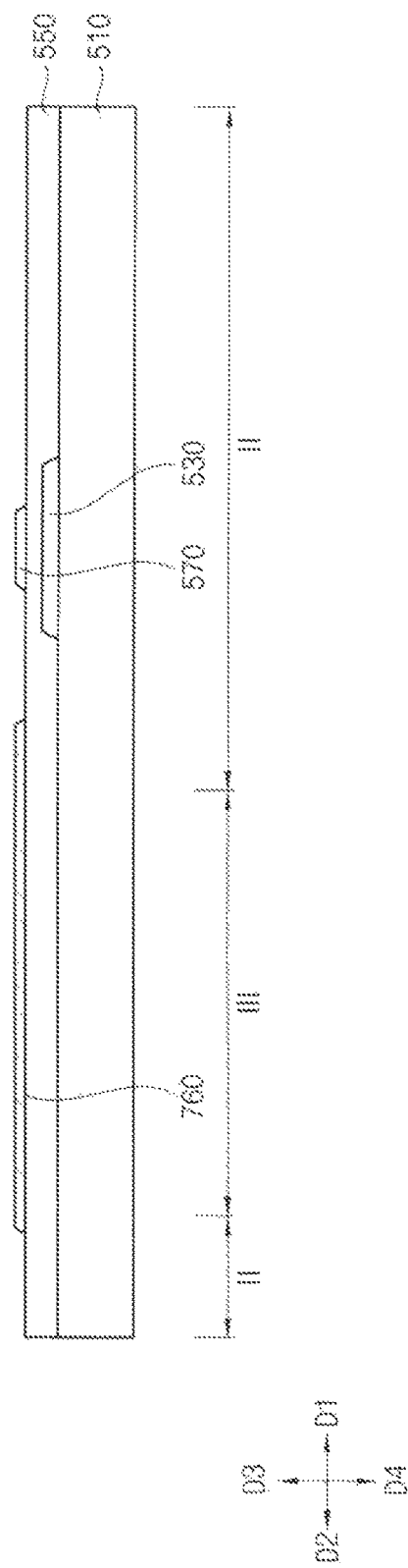
FIGS. 4, 5, 6, 7, 8, 9, and 10 are cross-sectional views illustrating a method of manufacturing an OLED device in accordance with example embodiments.

Referring to FIG. 4, an active layer 530 may be formed in a sub-pixel region II on a substrate 510. The active layer 530 may be formed using an oxide semiconductor, an inorganic semiconductor, an organic semiconductor, etc. The substrate 510 may be formed using quartz, synthetic quartz, calcium fluoride, fluoride-doping quartz, a sodalime glass, a non-alkali glass etc. Alternatively, a buffer layer may be formed on the substrate 510. The buffer layer may extend along a first direction that is parallel to an upper surface of the substrate 510. That is, the buffer layer may be entirely formed on the substrate 510. The buffer layer may prevent the diffusion of metal atoms and/or impurities from the substrate 510. A gate insulation layer 550 may be formed on the substrate 510. The gate insulation layer 550 may cover the active layer 530, and may extend in the first direction on the substrate 510. The gate insulation layer 550 may be entirely formed in the sub-pixel region II and the transparent region III on the substrate 510. The gate insulation layer 550 may be formed using a silicon compound, a metal oxide, etc.

A gate electrode 570 may be formed on a portion of the gate insulation layer 550 under which the active layer 530 is located, to overlap the active layer 530 in plan view. A second lower electrode 760 may be spaced apart from the gate electrode 570 in a transparent region III and a portion of the sub-pixel region II on the gate insulation layer 550. In example embodiments, the second lower electrode 760 and the gate electrode 570 may be located at the same level or layer, may be simultaneously formed using the same materials. In addition, the second lower electrode 760 and the gate electrode 570 may have the same thickness (e.g., a second thickness), and the second lower electrode 760 may transmit a light. In example embodiments, the second lower electrode 760 may be transparent.

Each of the gate electrode 570 and the second lower electrode 760 may include a metal, a metal alloy, metal nitride, conductive metal oxide, transparent conductive materials, etc. For example, each of the gate electrode 570 and the second lower electrode 760 may be formed using Au, Ag, Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in any suitable combination thereof.

Figure 5:
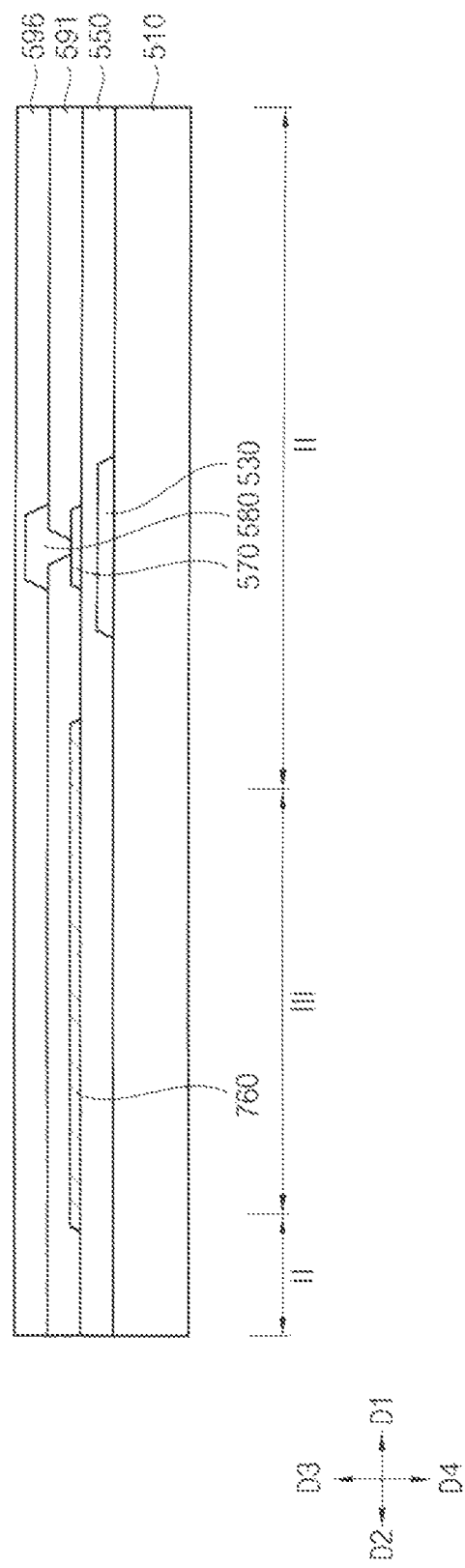

Referring to FIG. 5, a preliminary first insulating interlayer 591 may be formed on the gate electrode 570 and the second lower electrode 760. The preliminary first insulating interlayer 591 may cover the gate electrode 570 and the second lower electrode 760, and may extend in the first direction D1 on the gate insulation layer 550. That is, the preliminary first insulating interlayer 591 may be formed on the entire gate insulation layer 550.

A gate wiring 580 may be formed on the preliminary first insulating interlayer 591. A thickness of the gate wiring 580 may be greater than that of the gate electrode 570. The gate wiring 580 may provide a gate signal of an OLED device to the gate electrode 570.

A preliminary second insulating interlayer 596 may be formed on the gate wiring 580. The preliminary second insulating interlayer 596 may cover the gate wiring 580, and may extend in the first direction D1 on the preliminary first insulating interlayer 591. That is, the preliminary second insulating interlayer 596 may be formed on the entire preliminary first insulating interlayer 591.

Figure 6:
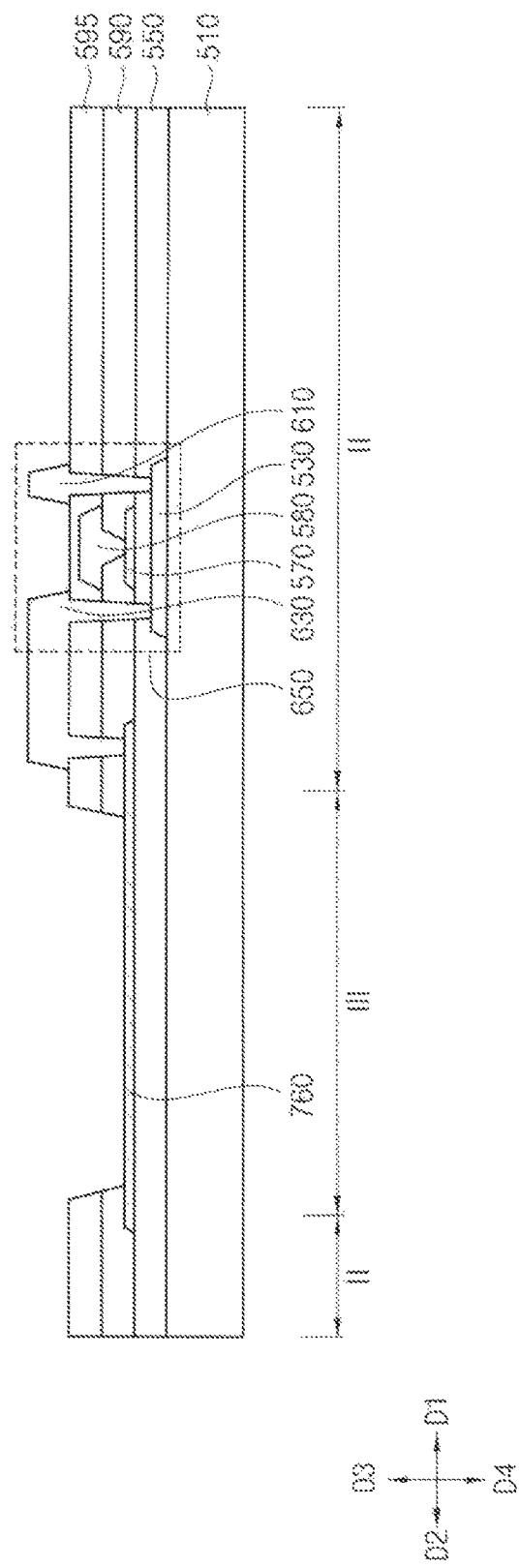

Referring to FIGS. 5 and 6, an opening may be formed in the preliminary first insulating interlayer 591 and the preliminary second insulating interlayer 596 that are located in the transparent region III. Also, first, second, and third contact holes may be formed in the sub-pixel region II. Accordingly, a first insulating interlayer 590 and a second insulating interlayer 595 may be formed. The first insulating interlayer 590 may have a first opening exposing a portion of a second lower electrode 760 in the transparent region III.

In addition, the second insulating interlayer 595 may have an opening (e.g., a third opening) in the transparent region III. Each of the first and second insulating interlayer 590 and 595 may include a silicon compound, a metal oxide, etc. In example embodiments, each of the first and second insulating interlayer 590 and 595 may be formed using inorganic materials.

A first electrode 610 and a second electrode 630 may be formed on the second insulating interlayer 595.

The first electrode 610 and the second electrode 630 may perforate or extend into the first, second, and third contact holes. For example, the first electrode 610 may be in contact with a first side of the active layer 530 via the third contact hole, and the second electrode 630 may be in contact with a second side of the active layer 530 via the second contact hole. Accordingly, a semiconductor element 650 including the active layer 530, the gate electrode 570, the first electrode 610, and the second electrode 630 may be formed.

In example embodiments, the second electrode 630 may extend into the transparent region III so as to overlap at least a portion of the second lower electrode 760. The second electrode 630 may be in contact with the second lower electrode 760 by extending into the first contact hole which exposes a portion of the second lower electrode 760. Thus, the semiconductor element 650 may be electrically connected to the second lower electrode 760. Each of the first electrode 610 and the second electrode 630 may be formed using a metal, an alloy, metal nitride, conductive metal oxide, transparent conductive materials, etc.

Figure 7:
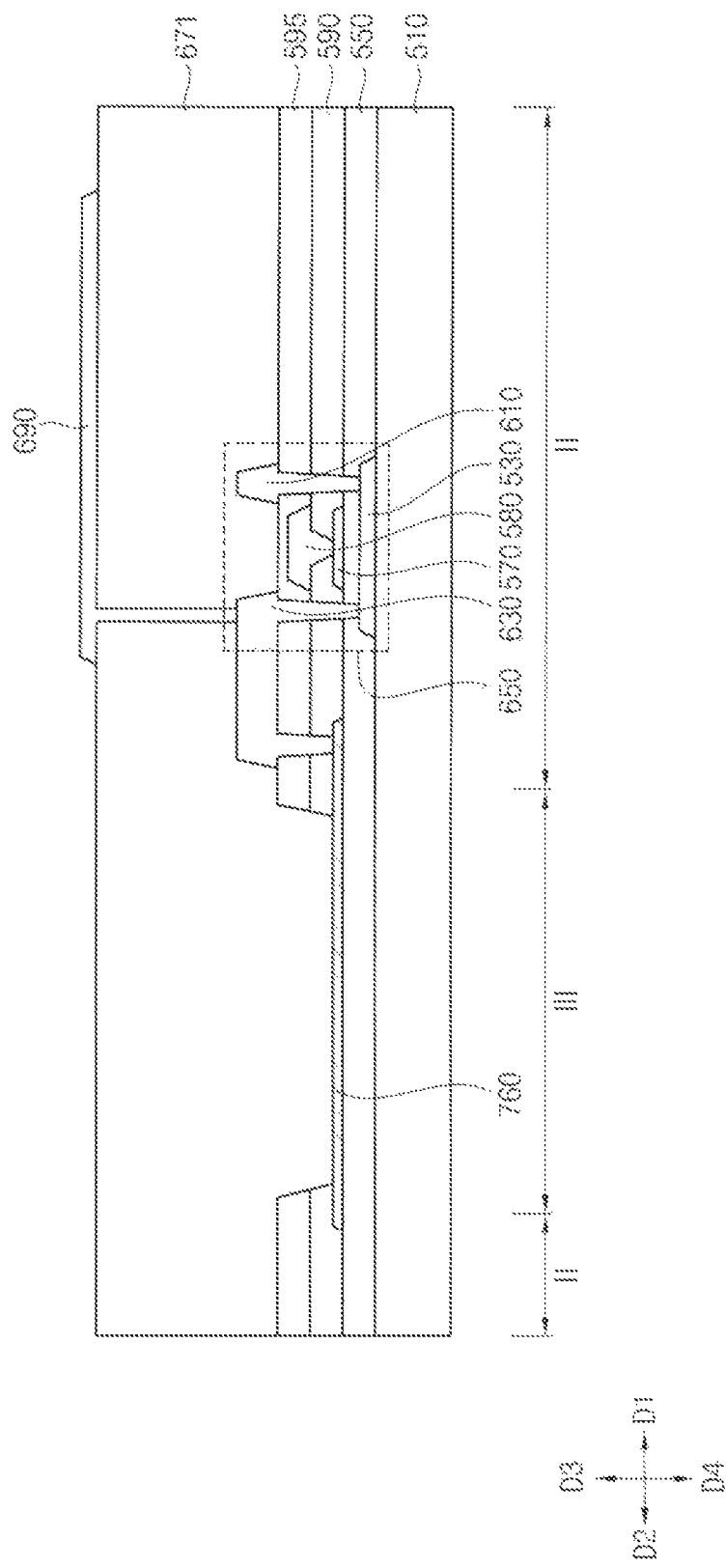

Referring to FIG. 7, a preliminary planarization layer 671 may be formed on the first electrode 610, the second electrode 630, the second insulating interlayer 595, and the second lower electrode 760. The preliminary planarization layer 671 may cover the first electrode 610, the second electrode 630, the second insulating interlayer 595, and the second lower electrode 760, and may extend in the first direction D1 on the first electrode 610, the second electrode 630, the second insulating interlayer 595, and the second lower electrode 760. Subsequently, a fourth contact hole exposing at least a portion of the second electrode 630 may be formed in the preliminary planarization layer 671. A lower electrode 690 may be formed at a first thickness on the preliminary planarization layer 671. Here, the first thickness is greater than a second thickness. The first lower electrode 690 may contact the second electrode 630 by extending through the fourth contact hole. Accordingly, the first lower electrode 690 and the semiconductor element 650 may be electrically connected. In some embodiments, such as the embodiment illustrated in FIG. 3, the first lower electrode 690 may have a multilayer structure. The multilayer structure may include first, second, and third electrode layers. The first electrode layer may be formed in the sub-pixel region II on the planarization layer, and the second electrode layer and the third electrode layer may be sequentially formed on the first electrode layer. The first lower electrode 690 may be formed using a metal, a metal alloy, metal nitride, conductive metal oxide, transparent conductive materials, etc.

Figure 8:
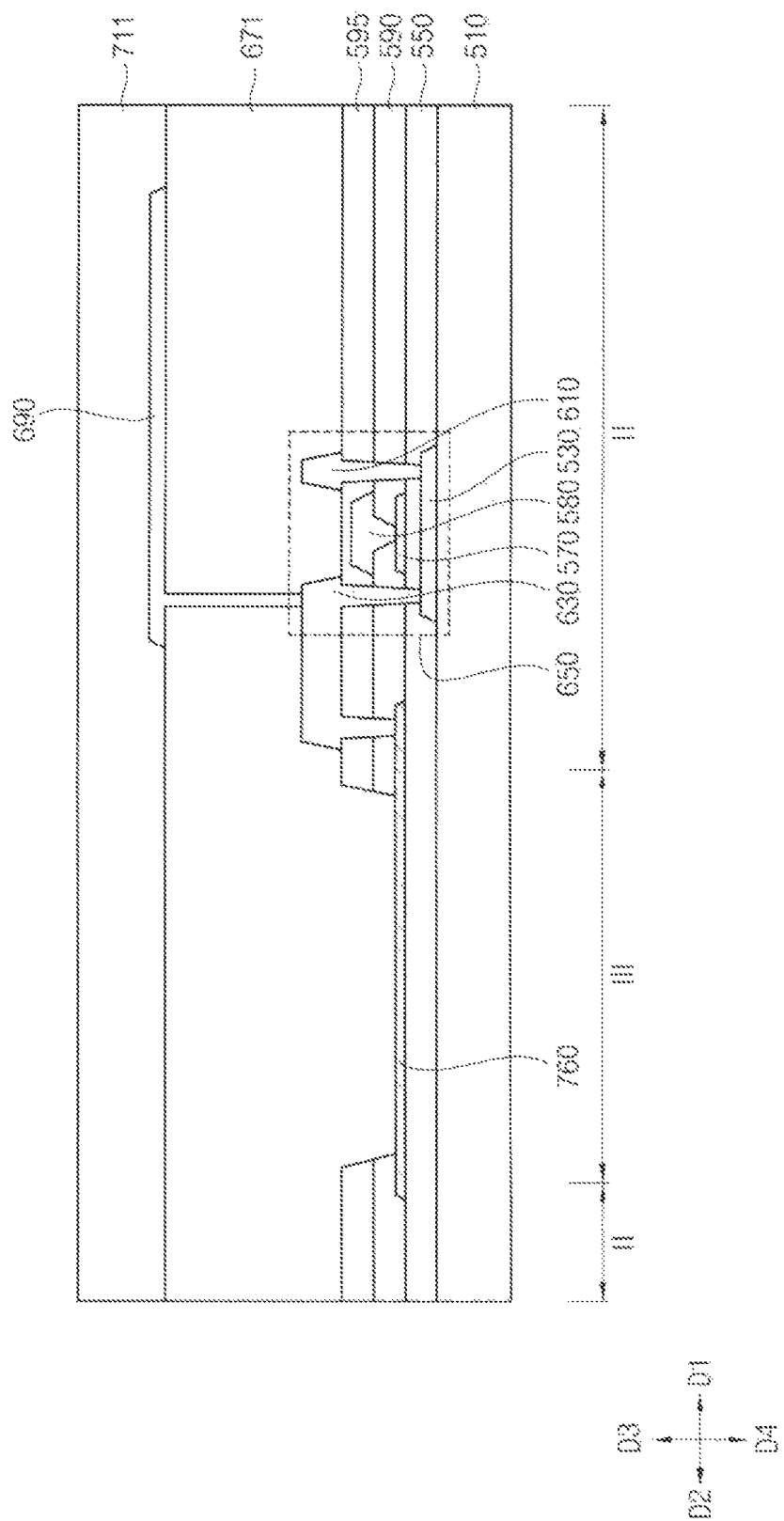

Referring to FIG. 8, a preliminary pixel defining layer 711 may be formed on the preliminary planarization layer 671. The preliminary pixel defining layer 711 may cover the first lower electrode 690 on the preliminary planarization layer 671, and may extend in the first direction D1. That is, the preliminary pixel defining layer 711 may be formed on the entire preliminary planarization layer 671.

Figure 9:
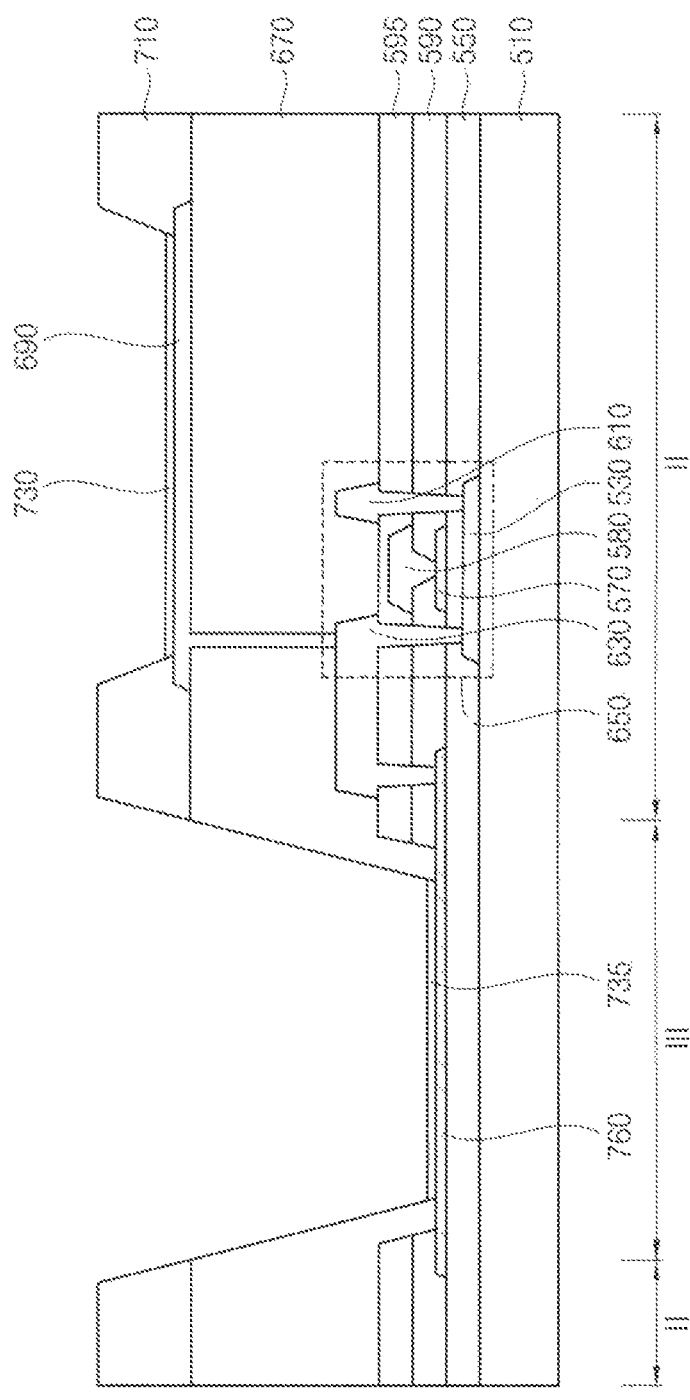

Referring to FIGS. 8 and 9, at least a portion of the second lower electrode 760 may be exposed by removing a portion of the preliminary planarization layer 671 and the preliminary pixel defining layer 711 in the transparent region III. Accordingly, a planarization layer 670 may be formed. The planarization layer 670 may have an opening (e.g., a second opening) exposing a portion of the second lower electrode 760 in the transparent region III. For example, the planarization layer 670 may be formed at a relatively high thickness to sufficiently cover the first and second electrodes 610 and 630. In this case, the planarization layer 670 may have a substantially even upper surface, and a planarization process may be further performed on the planarization layer 670 to implement an even upper surface of the planarization layer 670. Alternatively, the planarization layer 270 may cover the first and second electrodes 210 and 230, and may be disposed at a substantially uniform thickness along a profile of the first and second electrodes 210 and 230.

In example embodiments, the planarization layer 670 may cover a side wall of the first opening of the first insulating interlayer 590 and a side wall of the third opening of the second insulating interlayer 595 in the transparent region III, and may be in contact with an upper surface of the second lower electrode 760. For example, the planarization layer 670 may not expose side walls of the first and third openings. That is, a size (e.g., an area or a dimension) of the second opening of the planarization layer 670 may be less than a size of the first and third openings. As at least a portion of the planarization layer 670 is formed on the second lower electrode 360, the planarization layer 670 may serve as a pixel defining layer in the transparent region III. The planarization layer 670 may include organic materials or inorganic materials. In example embodiments, the planarization layer 670 may include organic materials. For example, the planarization layer 670 may be formed using a photoresist, a polyacryl-based resin, a polyimide-based resin, a polyamide-based resin, a siloxane-based resin, an acryl-based resin, an epoxy-based resin, etc.

At least a portion of the first lower electrode 690 may be exposed by removing at least a portion of the preliminary pixel defining layer 711 in the sub-pixel region II. Accordingly, a pixel defining layer 710 may be formed. The pixel defining layer 710 may expose a portion of the first lower electrode 690 and at least a portion of the second lower electrode 760. For example, the pixel defining layer 710 may cover outer edges of the first lower electrode 690, and may also expose the second opening of the planarization layer 670. The pixel defining layer 710 may include organic materials or inorganic materials. In example embodiments, the pixel defining layer 710 may be formed using organic materials.

A first light emitting layer 730 may be formed on the exposed portion of the first lower electrode 690. The first light emitting layer 730 may be formed using at least one of light emitting materials capable of generating different colors of light (e.g., a red color, a blue color, or a green color, etc.) in, for example, the first, second, and third sub-pixels of FIG. 1, and may emit their light in the third direction D3. Alternatively, the first light emitting layer 730 may generate white light by stacking a plurality of light emitting materials capable of generating different colors of light such as a red color, a green color, a blue color, etc. In this case, a color filter may be formed on the first light emitting layer 730, and may not be formed in the transparent region III. The color filter may include at least one selected from a red color filter, a green color filter, and a blue color filter. Alternatively, the color filter may include one or more of a yellow color filter, a cyan color filter, and a magenta color filter. The color filter may be formed of a photosensitive resin (or color photoresist), etc.

A second light emitting layer 735 may be formed on a portion where at least a portion of the second lower electrode 760 is exposed. The second light emitting layer 735 may emit white light as in the fourth sub-pixel of FIG. 1. The second light emitting layer 735 may be controlled by the semiconductor element 650. For example, when the semiconductor element 650 is activated (e.g., turned-on), the second light emitting layer 735 may emit white light in the third direction D3 and the fourth direction D4. Here, the third direction D3 may be orthogonal to the first direction D1 and the second direction D2, and the third direction D3 is opposite to the fourth direction D4. When the semiconductor element 650 is not activated (e.g., turned-off), an image of an object that is located behind the OLED device may be transmitted via the transparent region III. The second light emitting layer 735 may have a tandem structure to emit white colored light. For example, the second light emitting layer 735 may include a red light emitting layer, a green light emitting layer, and a blue light emitting layer, and charge generation layers (CGL) may be interposed between the red light emitting layer and the green light emitting layer, as well as between the green light emitting layer and the blue light emitting layer. For example, the red light emitting layer, a first CGL, the green light emitting layer, a second CGL, and the blue light emitting layer may be sequentially disposed on the second lower electrode 760.

Figure 10:
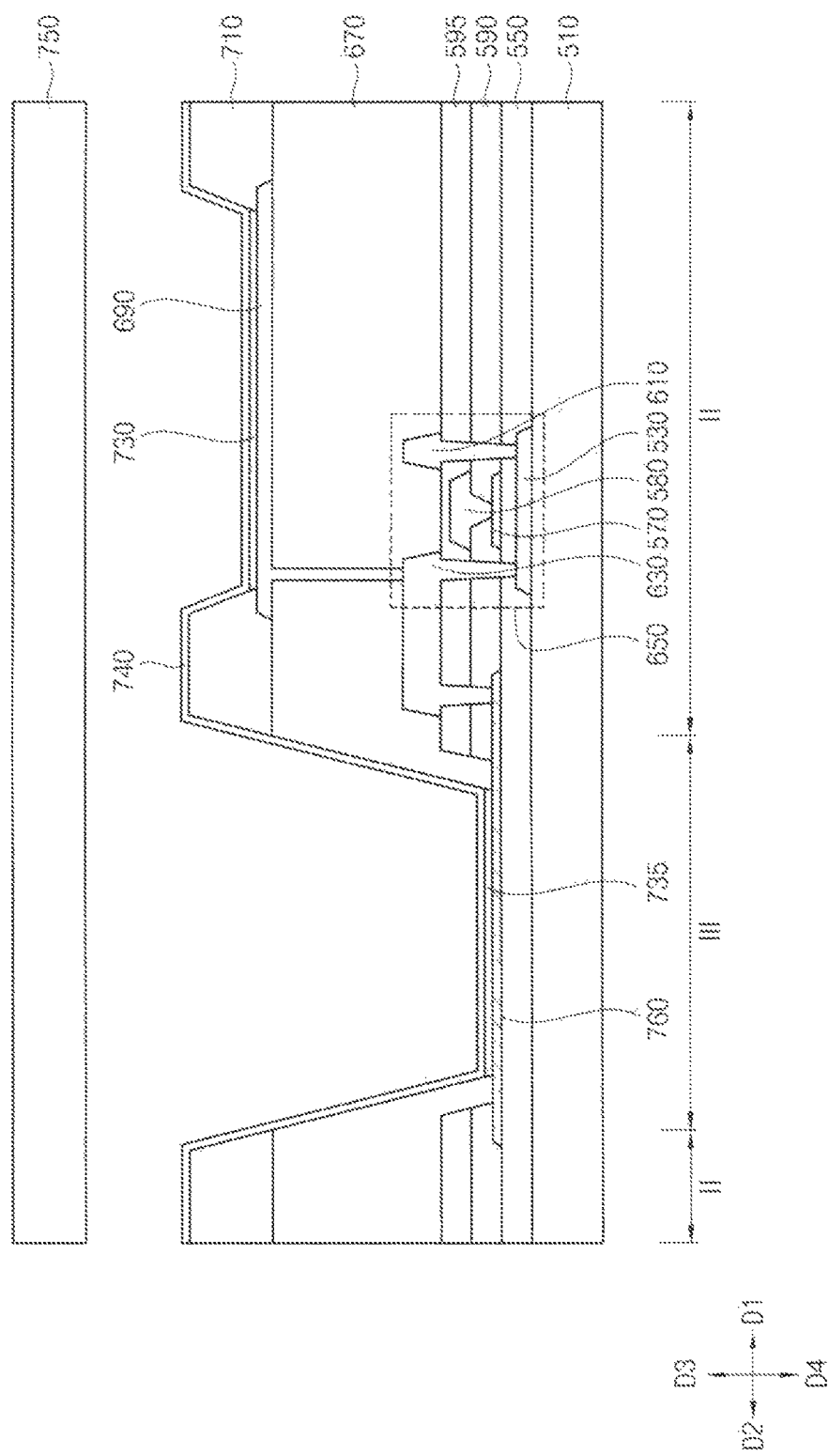

Referring to FIG. 10, an upper electrode 740 may be formed on the pixel defining layer 710 and the first and second light emitting layers 730 and 735. The upper electrode 740 may cover the pixel defining layer 710 and the first and second light emitting layers 730 and 735 in the sub-pixel region II and the transparent region III. The upper electrode 740 may be formed using a metal, a metal alloy, metal nitride, conductive metal oxide, transparent conductive materials, etc. These may be used alone or in any suitable combination thereof.

The encapsulation substrate 750 may be formed on the upper electrode 740. The encapsulation substrate 750 and the substrate 510 may include substantially the same materials. For example, the encapsulation substrate 750 may include quartz, synthetic quartz, calcium fluoride, fluoride-doping quartz, sodalime glass, non-alkali glass etc. The encapsulation substrate 750 is combined with the substrate 510 by performing an encapsulation process on the upper electrode 740. Accordingly, the OLED device illustrated in FIG. 2 may be manufactured.

Figure 11:
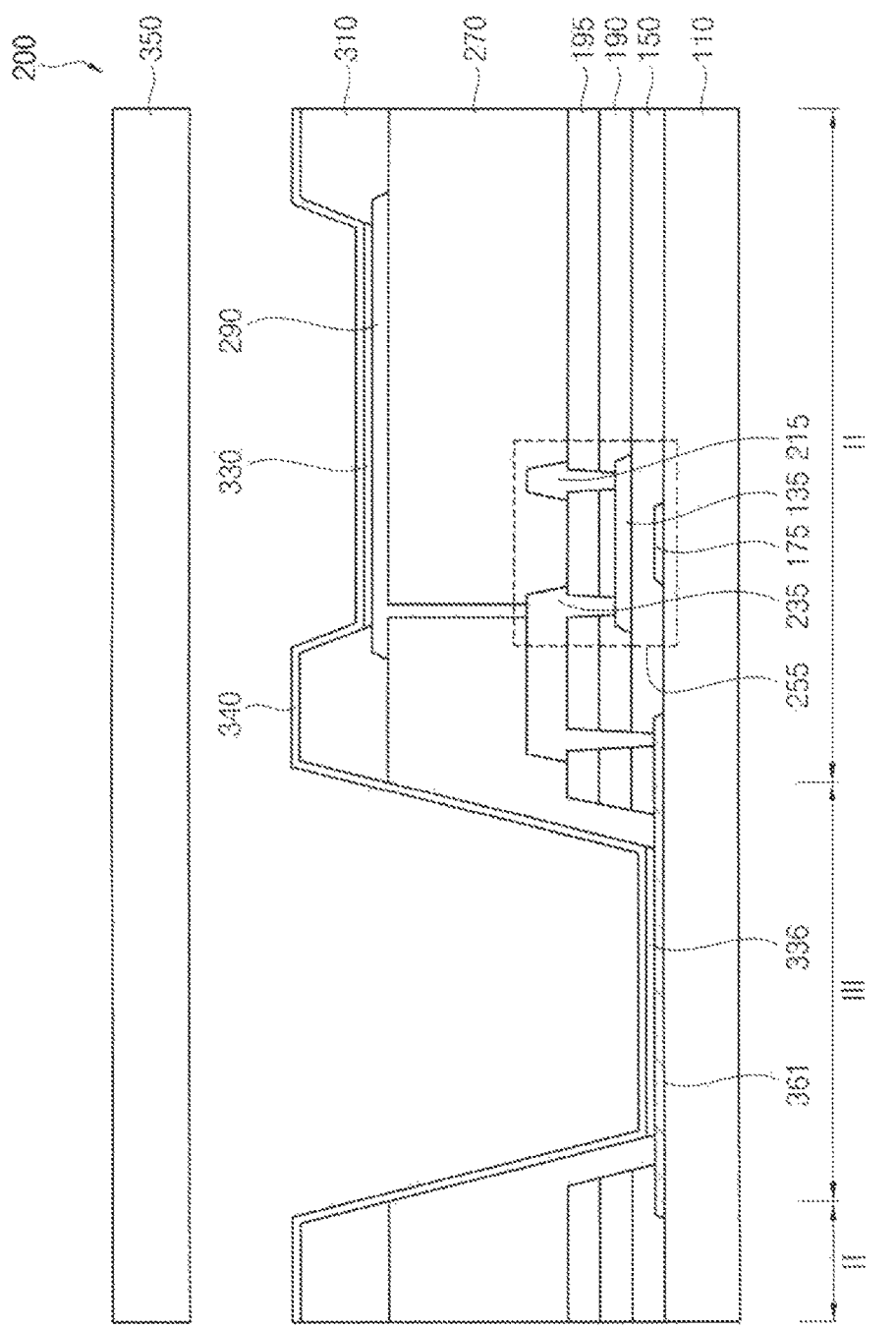
FIG. 11 is a cross-sectional view illustrating an OLED device in accordance with example embodiments.

FIG. 11 is a cross-sectional view illustrating an OLED device in accordance with example embodiments. An OLED device 200 illustrated in FIG. 11 may have a configuration substantially the same as or similar to that of an OLED device 100 described with reference to FIG. 2, except for the configuration of a semiconductor element 255. In FIG. 11, detailed descriptions for elements which are substantially the same as or similar to elements described with reference to FIG. 2 will be omitted.

Referring to FIG. 11, an OLED device 200 may include a substrate 110, a gate insulation layer 150, a semiconductor element 255, a first insulating interlayer 190, a second insulating interlayer 195, a planarization layer 270, a first lower electrode 290, a pixel defining layer 310, a second lower electrode 361, a first light emitting layer 330, a second light emitting layer 336, an upper electrode 340, an encapsulation substrate 350, etc. Here, the semiconductor element 255 may include an active layer 135, a gate electrode 175, a first electrode 215, and a second electrode 235. In addition, the first lower electrode 290 may have a first thickness, and the second lower electrode 361 may have a second thickness that is less than the first thickness.

The gate electrode 175 may be disposed in the sub-pixel region II on the substrate 110. The gate electrode 175 may be located under which the active layer 135 to overlap the active layer 135 in a plan view. In example embodiments, the gate electrode 175 may have a relatively thin thickness (e.g., a second thickness), and may be substantially transparent. Since a thickness of the gate electrode 175 is thin, a wiring resistance of the gate electrode 175 may be high. Thus, the gate electrode 175 may not perform a wiring function providing a gate signal of the OLED device 200, and may instead only serve as a gate electrode switching the active layer 135. The gate signals of the OLED device 200 may be provided by a separate gate wiring, and the gate wiring may be electrically connected to the gate electrode 175. In this manner, the gate wiring may provide the gate signals to the gate electrode 175.

The second lower electrode 361 may be spaced apart from the gate electrode 175 in the transparent region III and a portion of the sub-pixel region II on the substrate 110. In example embodiments, the second lower electrode 361 and the gate electrode 175 may be disposed at the same level, and may be simultaneously formed using the same materials. The second lower electrode 361 and the gate electrode 175 may have the same thickness, and the second lower electrode 361 may transmit light. For example, light incident from external sources may be transmitted via the transparent region III.

The gate insulation layer 150 may be disposed on the second lower electrode 361 and the gate electrode 175. The gate insulation layer 150 may extend in a first direction D1 on the substrate 110. Here, the first direction D1 may be parallel to an upper surface of the substrate 110, or may be from the transparent region III into the sub-pixel region II. The gate insulation layer 150 may have a first opening exposing a portion of the second lower electrode 361 in the transparent region III, and may cover the gate electrode 175 in the sub-pixel region II. The gate insulation layer 150 may be formed of a silicon compound, a metal oxide, etc. In example embodiments, the gate insulation layer 150 may include inorganic materials.

The active layer 135 may be disposed in the sub-pixel region II on the gate insulation layer 150. The active layer 135 may overlap the gate electrode 175. As an example, the active layer 135 may be formed of an oxide semiconductor, an inorganic semiconductor (e.g., amorphous silicon, polysilicon, etc.), an organic semiconductor, etc.

The first insulating interlayer 190 may be disposed on the active layer 135. The first insulating interlayer 190 may extend in the first direction D1 on the gate insulation layer 150, and may have a second opening exposing a portion of the second lower electrode 361 in the transparent region III. In addition, the first insulating interlayer 190 may cover the active layer 135 in the sub-pixel region II. The first insulating interlayer 190 may include a silicon compound, a metal oxide, etc. In example embodiments, the first insulating interlayer 190 may be formed of inorganic materials.

While not shown in FIG. 11, a gate wiring may be disposed on the first insulating interlayer 190 in known manner. As described above, the gate wiring may provide a gate signal of the OLED device 200 to the gate electrode 175. The gate wiring may be in contact with the gate electrode 175 via a contact hole formed in the first insulating interlayer 190, so that the gate wiring and the gate electrode 175 are electrically connected. Since the thickness of the gate wiring is greater than that of the gate electrode 170, the gate wiring may have a relatively low wiring resistance.

The second insulating interlayer 195 may be disposed on the gate wiring. The second insulating interlayer 195 may be interposed between the first insulating interlayer 190 and the planarization layer 270. The second insulating interlayer 195 may extend in the first direction D1 on the first insulating interlayer 190, and may have an opening exposing a portion of the second lower electrode 361 in the transparent region III. In addition, the second insulating interlayer 195 may cover the gate wiring in the sub-pixel region II. The second insulating interlayer 195 may be formed of a silicon compound, a metal oxide, etc. In example embodiments, the second insulating interlayer 195 may include inorganic materials.

The first electrode 215 and the second electrode 235 may be disposed on the second insulating interlayer 195. The first electrode 215 may be in contact with a first side of the active layer 130 via a contact hole formed in the first insulating interlayer 190 and second insulating interlayer 195. The second electrode 230 may be in contact with a second side of the active layer 130 via another contact hole formed in the first insulating interlayer 190 and the second insulating interlayer 195. Accordingly, the semiconductor element 255 is formed which includes the first active layer 135, the gate electrode 175, the first electrode 215, and the second electrode 235.

In example embodiments, the second electrode 235 may extend from the sub-pixel region II into the transparent region III, to overlap at least a portion of the second lower electrode 361. The gate insulation layer 150 may have a first contact hole exposing a portion of the second lower electrode 361. In addition, the first insulating interlayer 190 may have a second contact hole exposing this first contact hole. Further, the second insulating interlayer 195 may have a third contact hole exposing the second contact hole. The second electrode 235 may be in contact with the second lower electrode 361 by extending through the first, second, and third contact holes. Thus, the semiconductor element 255 may be electrically connected to the second lower electrode 361. Each of the first electrode 215 and the second electrode 235 may be formed of a metal, an alloy, metal nitride, conductive metal oxide, transparent conductive materials, etc.

The planarization layer 270 may be disposed on the first and second electrodes 215 and 235. The planarization layer 270 may extend in the first direction D1 on the second insulating interlayer 195. The planarization layer 270 may have a third opening exposing a portion of the second lower electrode 361 in the transparent region III, and may cover the first electrode 215 and the second electrode 235 in the sub-pixel region II.

In example embodiments, the planarization layer 270 may cover a side wall of the first opening of the gate insulation layer 150 and a side wall of the second opening of the first insulating interlayer 190 in the transparent region III, and may be in contact with an upper surface of the second lower electrode 361. The planarization layer 270 may not expose the side walls of the gate insulation layer 150 and first insulating interlayer 190. That is, a size (e.g., an area or a dimension) of the third opening of the planarization layer 270 may be less than a size of the first and second openings. As at least a portion of the planarization layer 270 is disposed on the second lower electrode 361, the planarization layer 270 may serve as a pixel defining layer in the transparent region III. The planarization layer 270 may include organic materials or inorganic materials. In example embodiments, the planarization layer 270 may include organic materials.

Accordingly, the OLED device 200 including the semiconductor element 255 of a bottom gate structure may be disposed.

Figure 12:
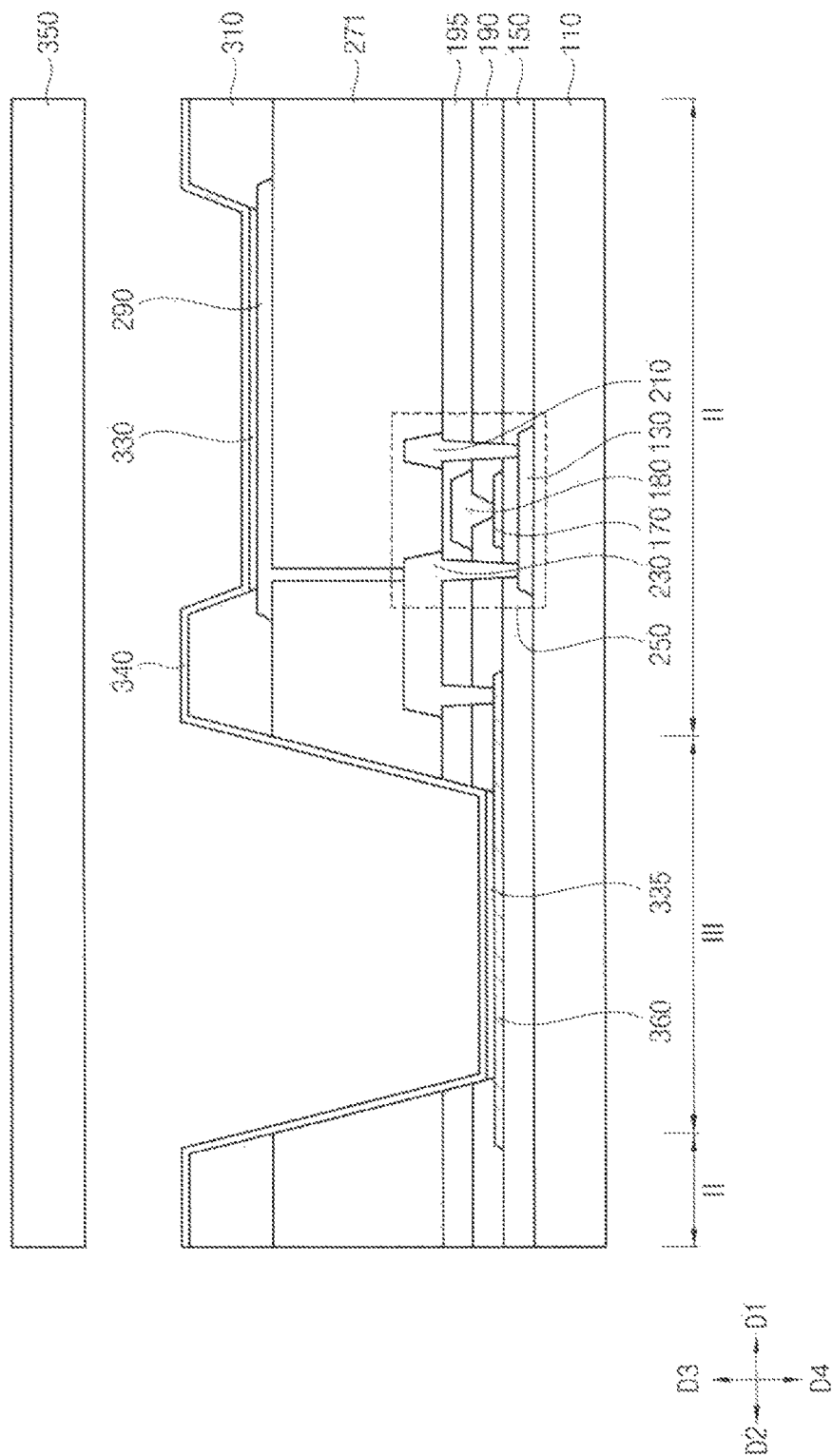
FIG. 12 is a cross-sectional view illustrating an OLED device in accordance with example embodiments.

FIG. 12 is a cross-sectional view illustrating an OLED device in accordance with example embodiments. An OLED device illustrated in FIG. 12 may have a configuration substantially the same as or similar to that of an OLED device 100 described with reference to FIG. 2, except for the configuration of a planarization layer 271. In FIG. 12, detailed descriptions for elements which are substantially the same as or similar to corresponding elements described with reference to FIG. 2 will be omitted.

Referring to FIG. 12, an OLED device may include a substrate 110, a gate insulation layer 150, a semiconductor element 250, a first insulating interlayer 190, a gate wiring 180, a second insulating interlayer 195, a planarization layer 271, a first lower electrode 290, a pixel defining layer 310, a second lower electrode 360, a first light emitting layer 330, a second light emitting layer 335, an upper electrode 340, an encapsulation substrate 350, etc. Here, the semiconductor element 250 may include an active layer 130, a gate electrode 170, a first electrode 210, and a second electrode 230.

In example embodiments, the planarization layer 271 may not cover a side wall of a first opening of the gate insulation layer 150, a side wall of a second opening of the first insulating interlayer 190, or a side wall of an opening of the second insulating interlayer 195 in the transparent region III. In this case, after a preliminary gate insulation layer, a preliminary first insulating interlayer, a preliminary second insulating interlayer, a preliminary planarization layer, and a preliminary pixel defining layer are disposed on the substrate 110, at least a portion of the second lower electrode 360 may be exposed by removing a portion of a preliminary gate insulation layer, a preliminary first insulating interlayer, a preliminary second insulating interlayer, a preliminary planarization layer, and a preliminary pixel defining layer each in the transparent region III. Here, the first insulating interlayer 190 acts as a pixel defining layer in transparent region III, rather than the planarization layer 271.

Figure 13:
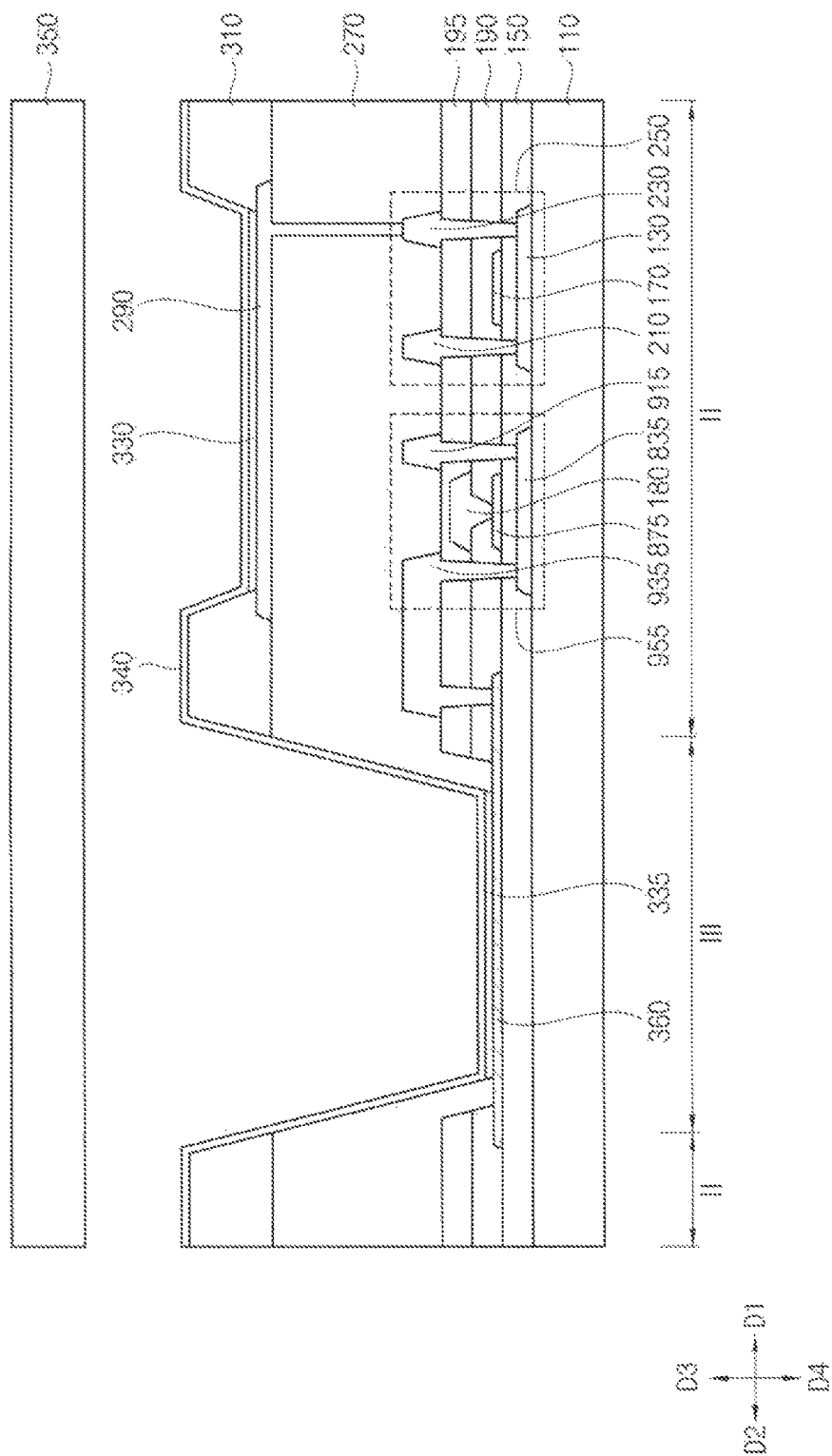
FIG. 13 is a cross-sectional view illustrating an OLED device in accordance with example embodiments.

FIG. 13 is a cross-sectional view illustrating an OLED device in accordance with example embodiments. An OLED device illustrated in FIG. 13 may have a configuration substantially the same as or similar to that of an OLED device 100 described with reference to FIG. 2, except for the presence of a second semiconductor element 955 and its associated electrical connections. In FIG. 13, detailed descriptions for elements which are substantially the same as or similar to corresponding elements described with reference to FIG. 2 will be omitted.

Referring to FIG. 13, an OLED device may include a substrate 110, a gate insulation layer 150, a first semiconductor element 250, a second semiconductor element 955, a first insulating interlayer 190, a gate wiring 180, a second insulating interlayer 195, a planarization layer 270, a first lower electrode 290, a pixel defining layer 310, a second lower electrode 360, a first light emitting layer 330, a second light emitting layer 335, an upper electrode 340, an encapsulation substrate 350, etc. Here, the first semiconductor element 250 may include an active layer 130, a gate electrode 170, a first electrode 210, and a second electrode 230, and the second semiconductor element 955 may include an active layer 835, a gate electrode 875, a first electrode 915, and a second electrode 935.

In example embodiments, as the OLED device includes the second semiconductor element 955, the first light emitting layer 330 and the second light emitting layer 335 may emit light independently. That is, as the first and second semiconductor elements 250 and 955 may control the first and second light emitting layers 330 and 335, respectively, so that the first and second light emitting layers 330 and 335 may simultaneously or independently emit light.

FIG. 14 is a cross-sectional view illustrating an OLED device in accordance with example embodiments. An OLED device illustrated in FIG. 14 may have a configuration substantially the same as or similar to that of an OLED device 100 described with reference to FIG. 2, except for the presence and structure of a gate wiring 181 and a conductive pattern 182. In FIG. 14, detailed descriptions for elements which are substantially the same as or similar to corresponding elements described with reference to FIG. 2 will be omitted.

Referring to FIG. 14, an OLED device may include a substrate 110, a gate insulation layer 150, a first semiconductor element 250, a first insulating interlayer 190, a gate wiring 181, a conductive pattern 182, a planarization layer 270, a first lower electrode 290, a pixel defining layer 310, a second lower electrode 360, a first light emitting layer 330, a second light emitting layer 335, an upper electrode 340, an encapsulation substrate 350, etc. Here, the semiconductor element 250 may include an active layer 130, a gate electrode 170, a first electrode 210, and a second electrode 230.

In example embodiments, the gate wiring 181 may be disposed on the gate electrode 170, and the conductive pattern 182 may be disposed on at least a portion of the second lower electrode 360. For example, a preliminary gate electrode may be disposed on the entire gate insulation layer 150, and a preliminary gate wiring may be disposed on the entire preliminary gate electrode. Then, the gate electrode 170, the gate wiring 181, and the conductive pattern 182 may be simultaneously formed by removing a portion of the preliminary gate electrode and the preliminary gate wiring using a half tone mask or a slit mask.

In this case, each of the gate wiring 181 and the conductive pattern 182 may reduce a wiring resistance of the gate electrode 170 and the second lower electrode 360, respectively. The thicknesses of the gate wiring 181 and the conductive pattern 182 may thus be greater than the thicknesses of the gate electrode 170 and second lower electrode 360, respectively.

Embodiments of the present invention may be applied to various display devices including an organic light emitting display device. For example, the present invention may be applied to a vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Various features of the above described and other embodiments can be mixed and matched in any manner, to produce further embodiments consistent with the invention.

What is claimed is:

1. An organic light emitting display (OLED) device, comprising:
a substrate including a plurality of pixel regions each having a sub-pixel region and a transparent region;
wherein each pixel region comprises:
an active layer in the sub-pixel region on the substrate;
a gate electrode overlapping the active layer;
a first electrode on the active layer, the first electrode being in contact with a first portion of the active layer;
a second electrode spaced apart from the first electrode on the active layer, the second electrode being in contact with a second portion of the active layer;
a first lower electrode in the sub-pixel region and connected to the second electrode, the first lower electrode having a first thickness;
a first light emitting layer in the sub-pixel region and positioned on the first lower electrode;
a second lower electrode in the transparent region on the substrate, the second lower electrode having a second thickness that is less than the first thickness and being electrically connected to the second electrode through a contact formed in an insulating layer that overlaps the second lower electrode and the second electrode in a plan view, wherein a height of a bottom surface of the second lower electrode is lower than a height of a bottom surface of the first lower electrode;
a second light emitting layer in the transparent region and positioned on the second lower electrode;
an upper electrode on the first and second light emitting layers.

2. The OLED device of claim 1, wherein a thickness of the second lower electrode is substantially the same as a thickness of the gate electrode, and
wherein the second lower electrode is located at a same level as the gate electrode, and the second lower electrode and the gate electrode comprise the same material.

3. The OLED device of claim 1, wherein the gate electrode is disposed on the active layer.

4. The OLED device of claim 3, further comprising an insulation layer covering a portion of an upper surface of the second lower electrode and disposed under the first lower electrode, and a planarization layer on the first insulating interlayer, the planarization layer having a second opening exposing a portion of the second lower electrode in the transparent region, the planarization layer covering the first and second electrodes in the sub-pixel region,
wherein the insulation layer includes
a first insulating interlayer on a gate insulation layer covering the active layer, the first insulating interlayer having a first opening exposing a portion of the second lower electrode in the transparent region, the first insulating interlayer covering the gate electrode in the sub-pixel region.

5. The OLED device of claim 4, each pixel region further comprising:
a gate wiring on the first insulating interlayer, the gate wiring configured to transmit a gate signal to the gate electrode, the gate wiring having a thickness that is greater than a thickness of the gate electrode; and
a second insulating interlayer between the first insulating interlayer and the planarization layer, the second insulating interlayer having a third opening exposing a portion of the second lower electrode in the transparent region, the second insulating interlayer covering the gate wiring in the sub-pixel region.

6. The OLED device of claim 4, wherein the planarization layer covers a side wall of the first opening of the first insulating interlayer in the transparent region, and is in contact with an upper surface of the second lower electrode.

7. The OLED device of claim 6, wherein a size of the second opening is less than a size of the first opening.

8. The OLED device of claim 7, wherein the gate insulation layer and the first insulating interlayer include one or more inorganic materials, and the planarization layer includes one or more organic materials.

9. The OLED device of claim 5, wherein the second electrode overlaps at least a portion of the second lower electrode.

10. The OLED device of claim 9, wherein the first insulating interlayer includes a first contact hole exposing a portion of the second lower electrode, and the second insulating interlayer includes a second contact hole exposing the first contact hole, and
wherein the second electrode extends into the first and second contact holes so as to contact the second lower electrode.

11. The OLED device of claim 9, wherein the planarization layer includes a third contact hole over the second electrode and the first lower electrode, and
wherein the first lower electrode extends into the third contact hole so as to contact the second electrode.

12. The OLED device of claim 1, wherein the active layer is disposed on the gate electrode.

13. The OLED device of claim 12, each pixel region further comprising:
a gate insulation layer on the substrate, the gate insulation layer having a first opening exposing a portion of the second lower electrode in the transparent region, the gate insulation layer covering the gate electrode in the sub-pixel region;
an insulating interlayer on the gate insulation layer, the insulating interlayer having a second opening exposing a portion of the second lower electrode in the transparent region, the insulating interlayer covering the active layer in the sub-pixel region; and
a planarization layer on the insulating interlayer, the planarization layer having a third opening exposing a portion of the second lower electrode in the transparent region, the planarization layer covering the first and second electrodes in the sub-pixel region;
wherein the planarization layer covers side walls of a first opening of the gate insulation layer and a second opening of the insulation interlayer in the transparent region, and contacts an upper surface of the second lower electrode gate.

14. The OLED device of claim 13, wherein a size of the third opening is less than a size of the first opening and less than a size of the second opening.

15. The OLED device of claim 14, wherein the gate insulation layer and the insulating interlayer include one or more inorganic materials, and the planarization layer includes one or more organic materials.

16. The OLED device of claim 13, wherein the second electrode overlaps at least a portion of the second lower electrode,
   wherein the gate insulation layer has a first contact hole exposing a portion of the second lower electrode, and the insulating interlayer has a second contact hole exposing the first contact hole,
   wherein the second electrode extends into the first and second contact holes so as to contact the second lower electrode,
   wherein the planarization layer has a third contact hole positioned over the second electrode and the first lower electrode, and
   wherein the first lower electrode extends into the third contact hole, so as to contact the second electrode.

17. The OLED device of claim 1, wherein the first light emitting layer is positioned so as to emit light in one direction perpendicular to an upper surface of the substrate, and the second light emitting layer is positioned so as to emit light in two directions that are both perpendicular to the upper surface of the substrate.

18. The OLED device of claim 1, wherein the first lower electrode is configured to reflect light emitted from the first light emitting layer, and the second lower electrode is configured to transmit light emitted from the second light emitting layer.

19. The OLED device of claim 18, wherein the second light emitting layer is configured to emit a white colored light or blue colored light.

20. The OLED device of claim 19, wherein when the second light emitting layer does not emit light, the transparent region is configured to pass light therethrough.

* * * * *